US011112424B2

(12) United States Patent
Matsuzawa

(10) Patent No.: US 11,112,424 B2
(45) Date of Patent: Sep. 7, 2021

(54) PHYSICAL QUANTITY SENSOR, COMPLEX SENSOR, INERTIAL MEASUREMENT UNIT, PORTABLE ELECTRONIC DEVICE, ELECTRONIC DEVICE, AND VEHICLE

(71) Applicant: Seiko Epson Corporation, Tokyo (JP)

(72) Inventor: Juichiro Matsuzawa, Minamiminowa (JP)

(73) Assignee: Seiko Epson Corporation

(*) Notice: Subject to any disclaimer, the term of this patent is extended or adjusted under 35 U.S.C. 154(b) by 163 days.

(21) Appl. No.: 16/114,311

(22) Filed: Aug. 28, 2018

(65) Prior Publication Data

US 2019/0064204 A1 Feb. 28, 2019

(30) Foreign Application Priority Data

Aug. 29, 2017 (JP) .............................. JP2017-164032

(51) Int. Cl.
| | | |
|---|---|---|
| *G01P 15/125* | (2006.01) | |
| *G01D 5/241* | (2006.01) | |
| *G01L 1/14* | (2006.01) | |
| *G01P 15/08* | (2006.01) | |
| *G01P 3/44* | (2006.01) | |

(Continued)

(52) U.S. Cl.
CPC .......... *G01P 15/125* (2013.01); *B81B 7/0048* (2013.01); *G01C 19/00* (2013.01); *G01D 5/241* (2013.01); *G01L 1/144* (2013.01); *G01P 1/023* (2013.01); *G01P 1/026* (2013.01); *G01P 3/44* (2013.01); *G01P 9/02* (2013.01); *G01P 15/0802* (2013.01); *G01P 15/18* (2013.01); *H01L 24/32* (2013.01); *B81B 2201/0235* (2013.01); *B81B 2201/0242* (2013.01); *B81B 2203/055* (2013.01); *B81B 2203/058* (2013.01); *B81B 2207/012* (2013.01); *B81C 2203/019* (2013.01); *B81C 2203/0145* (2013.01); *B81C 2203/032* (2013.01); *H01L 2224/48091* (2013.01);

(Continued)

(58) Field of Classification Search
CPC ...... G01P 15/125; G01P 15/0802; G01P 3/44; G01P 9/02; G01P 1/023; G01P 1/026; G01P 15/08; G01D 5/241; G01L 1/144; G01C 19/00; H01L 2924/14; H01L 224/48091; H01L 2924/1461; H01L 2924/15787; B81C 2203/0145; B81C 2203/032; B81C 2203/019; B81B 2201/0235; B81B 2207/012; B81B 2203/055; B81B 7/0048; B81B 2203/058; B81B 2201/0242

USPC ...................... 73/23.31–23.42, 31.01–31.06, 73/335.01–335.14, 35.07–35.13, 649–661, 73/763–780, 493, 504.12–504.16, 73/514.01–514.38, 715–731, 756

See application file for complete search history.

(56) References Cited

U.S. PATENT DOCUMENTS

| | | | | |
|---|---|---|---|---|
| 5,545,912 A | * | 8/1996 | Ristic ...................... | G01P 1/023 257/417 |
| 2006/0027915 A1 | | 2/2006 | Tarn | |
| 2014/0238131 A1 | * | 8/2014 | Yoshiuchi ............... | H01L 24/32 73/514.16 |

FOREIGN PATENT DOCUMENTS

| | | |
|---|---|---|
| JP | 2007-139505 A | 6/2007 |
| JP | 2009-130056 A | 6/2009 |

* cited by examiner

*Primary Examiner* — Robert R Raevis
(74) *Attorney, Agent, or Firm* — Harness, Dickey & Pierce, P.L.C.

(57) ABSTRACT

A physical quantity sensor includes a sensor element (acceleration sensor element) and a substrate (package) to which (Continued)

the sensor element is attached using a bonding material (resin adhesive), in which, when an elastic modulus of the bonding material is e, 2.0 GPa<e<7.8 GPa is satisfied.

11 Claims, 23 Drawing Sheets

(51) Int. Cl.
*H01L 23/00* (2006.01)
*B81B 7/00* (2006.01)
*G01P 1/02* (2006.01)
*G01P 15/18* (2013.01)
*G01C 19/02* (2006.01)
*G01C 19/00* (2013.01)

(52) U.S. Cl.
CPC .. *H01L 2924/14* (2013.01); *H01L 2924/1461* (2013.01); *H01L 2924/15787* (2013.01)

| ELASTIC MODULUS [GPa] | 0.3 | 1.0 | 2.0 | 2.5 | 4.0 | 5.0 | 6.0 | 7.0 | 8.0 |
|---|---|---|---|---|---|---|---|---|---|
| HYSTERESIS IMPROVEMENT EFFECT (Ave.) [%] | 164 | 100 | 42 | 28 | 17 | 18 | 21 | 28 | 57 |

| ADHESIVE | A | B | C | D | E | F | G | H | I |
|---|---|---|---|---|---|---|---|---|---|
| ELASTIC MODULUS [GPa] | 0.3 | 1.0 | 2.0 | 2.5 | 4.0 | 5.0 | 6.0 | 7.0 | 8.0 |
| ZERO G BIAS TEMPERATURE CHARACTERISTIC | N/A | N/A | B/P | Good | Good | Good | Good | Good | B/P | ized
PHYSICAL QUANTITY SENSOR, COMPLEX SENSOR, INERTIAL MEASUREMENT UNIT, PORTABLE ELECTRONIC DEVICE, ELECTRONIC DEVICE, AND VEHICLE

BACKGROUND

1. Technical Field

The present invention relates to a physical quantity sensor, an electronic device, and a vehicle.

2. Related Art

In recent years, a physical quantity sensor manufactured using a silicon micro electro mechanical system (MEMS) technology is developed as an electronic device. As such a physical quantity sensor, for example, JP-A-2007-139505 discloses an electrostatic capacitance type physical quantity sensor (mechanical quantity sensor) that has an element having a movable electrode and a fixed electrode disposed opposite to each other in a comb teeth shape and measures physical quantity based on electrostatic capacitance between these two electrodes. In a case where a physical quantity sensor with such a configuration is mounted on a circuit substrate or a package using a bonding material, warpage occurs in a container of the physical quantity sensor due to stress resulting from the mounting. There is a concern that measurement accuracy may be affected by fluctuation generated in electrostatic capacitance generated between the movable electrode and the fixed electrode caused by distortion in the electrodes resulting from stress being applied to a sensor element stored in an inner portion due to the warpage occurring in the container.

In order to reduce the stress applied to such an element described above in the electronic device, JP-A-2009-130056 discloses a method of performing multipoint application of applying an adhesive such as a silicone resin on a plurality of points of a rear surface of a semiconductor element instead of application on an entire surface thereof, for example. In other words, it is described that the stress generated in the semiconductor element can be relaxed by mounting the semiconductor element on a substrate by a multipoint support with the adhesive. U.S. 2006/0027915A discloses a method of disposing an intermediate layer as a spacer for relaxing stress between an element and a substrate of a package and mounting the element on the substrate of the package.

However, in the configuration described in JP-A-2009-130056 and U.S. 2006/0027915A, since change (deterioration) is generated in physical properties of a cured adhesive on which an element such as a semiconductor element is mounted resulting from heating processing such as attaching an electronic device on a circuit substrate or a package, there is a problem that the stress applied to the element cannot be sufficiently relaxed. In such a physical quantity sensor described in JP-A-2007-139505, there is a problem that a so-called temperature hysteresis, in which a difference between a measurement signal of temperature increase and temperature decrease is generated in temperature characteristics of the measurement signal output from a physical quantity sensor, is generated.

SUMMARY

An advantage of some aspects of the invention is to solve at least a part of the problems described above, and the invention can be implemented as the following forms or application examples.

Application Example 1

A a physical quantity sensor according to an application example includes: a sensor element; and a substrate to which the sensor element is attached using a bonding material, in which, when an elastic modulus of the bonding material is e, $2.0\text{ GPa}<e<7.8\text{ GPa}$ is satisfied.

According to the physical quantity sensor according to this application example, it is possible to reduce the temperature hysteresis resulting from heating processing such as attachment on a circuit substrate or a package by optimizing the elastic modulus e of the bonding material that attaches the sensor element on the substrate to satisfy $2.0\text{ GPa}<e<7.8$ GPa. The elastic modulus e uses GPa (gigapascal) as its unit.

Application Example 2

In the physical quantity sensor according to the application example, it is preferable that $2.0\text{ GPa}<e\leq7.5\text{ GPa}$ is satisfied.

According to this application example, it is possible to further reduce the temperature hysteresis resulting from heating processing such as attachment on a circuit substrate or a package by further optimizing the elastic modulus e of the bonding material that attaches the sensor element on the substrate to satisfy $2.0\text{ GPa}<e\leq7.5\text{ GPa}$.

Application Example 3

In the physical quantity sensor according to the application example, it is preferable that $2.5\text{ GPa}\leq e\leq7.0\text{ GPa}$ is satisfied.

According to this application example, it is possible to further preferably reduce the temperature hysteresis resulting from heating processing such as attachment on a circuit substrate or a package by further optimizing the elastic modulus e of the bonding material that attaches the sensor element on the substrate to satisfy $2.5\text{ GPa}<e\leq7.0\text{ GPa}$.

Application Example 4

In the physical quantity sensor according to the application example, it is preferable that $3.4\text{ GPa}\leq e\leq6.0\text{ GPa}$ is satisfied.

According to this application example, it is possible to particularly preferably reduce the temperature hysteresis resulting from heating processing such as attachment on a circuit substrate or a package by further optimizing the elastic modulus e of the bonding material that attaches the sensor element on the substrate to satisfy $3.4\text{ GPa}<e\leq6.0$ GPa.

Application Example 5

In the physical quantity sensor according to the application example, it is preferable that a glass transition temperature of the bonding material is outside an operation temperature range of the sensor element.

According to this application example, since the glass transition temperature (Tg) of the bonding material that attaches the sensor element on the substrate is outside the operation temperature range of the sensor element, the physical properties of the bonding material hardly changes within the operation temperature range, and thereby, it is possible to further stabilize the temperature characteristics of the sensor element.

Application Example 6

In the physical quantity sensor according to the application example, it is preferable that a thickness of the bonding material is less than 50 μm.

According to this application example, by setting the thickness of the bonding material that attaches the sensor element on the substrate to less than 50 μm, it is possible to reduce influence on the characteristics of the sensor element due to the change in the physical properties of the bonding material resulting from heating processing and the like.

Application Example 7

In the physical quantity sensor according to the application example, in a plan view seen from an attachment direction of the sensor element and the substrate, it is preferable that a ratio of a bonding area of the bonding material with respect to an area where the substrate and the sensor element overlap is higher than or equal to 80%.

According to this application example, as the bonding area of the bonding material becomes larger, variations of the characteristics of the sensor element can be reduced, and it is possible to stabilize the characteristics of the sensor element by particularly setting the ratio of the bonding area of the bonding material to higher than or equal to 80%.

Application Example 8

In the physical quantity sensor according to the application example, it is preferable that a circuit element that is electrically connected to the sensor element is included.

According to this application example, it is possible to control the sensor element by the circuit element electrically connected to the sensor element.

Application Example 9

In the physical quantity sensor according to the application example, it is preferable that the circuit element is attached to a surface, on a side opposite to a side of the substrate, of the sensor element.

According to this application example, it is possible to increase the disposal efficiency in the plane direction by stacking the substrate, the sensor element, and the circuit element, and thereby, it is possible to reduce the area of physical quantity sensor in the plan view.

Application Example 10

In the physical quantity sensor according to the application example, it is preferable that a lid bonded with the substrate so as to configure a storage space with the substrate is included, and the sensor element and the circuit element is in the storage space.

According to this application example, it is possible to provide a compact physical quantity sensor with high performance by storing the sensor element and the circuit element in the storage space provided between the substrate and the lid.

Application Example 11

In the physical quantity sensor according to the application example, it is preferable that the sensor element includes a base substrate, a cap bonded with the base substrate so as to constitute a storage space between the cap and the base substrate, and a sensor unit that is stored in the storage space.

According to this application example, since the sensor unit is stored in a storage space constituted with the base substrate and the cap bonded with the base substrate, it is possible to perform a measurement of the sensor unit with higher accuracy.

Application Example 12

In the physical quantity sensor according to the application example, it is preferable that the base substrate is formed of a silicon material or a glass material.

According to this application example, it is possible to easily bond the base substrate with the sensor unit, and since light transmittance can be imparted to the base substrate, the inner portion of the storage space can be observed through the base substrate.

Application Example 13

In the physical quantity sensor according to the application example, it is preferable that the sensor unit is formed of silicon material.

According to this application example, bonding the sensor unit with the base substrate can be carried out easily by using an anodic bonding.

Application Example 14

In the physical quantity sensor according to the application example, it is preferable that the cap is formed of silicon or glass.

According to this application example, it is possible to easily bond the cap with the base substrate, and since light transmittance can be imparted to the cap, the inner portion of the storage space can be easily observed through the cap.

Application Example 15

In the physical quantity sensor according to the application example, it is preferable that the substrate is formed of any one of ceramics, glass, silicon, resin, and metal.

According to this application example, a container physical quantity sensor can be formed of easily available general materials.

Application Example 16

A physical quantity sensor according to this application example includes: a sensor element; a circuit element that is electrically connected to the sensor element; and a substrate to which the circuit element is attached. The sensor element is attached to a surface, on a side opposite to a side of the circuit element, of the sensor element of the substrate using bonding material, and when an elastic modulus of the bonding material is e, $2.0 \text{ GPa} < e < 8.0 \text{ GPa}$ is satisfied.

According to the physical quantity sensor according to this application example, since the sensor element is electrically connected to a side opposite to a side of substrate of the circuit element attached to the substrate, it is possible to modularize the physical quantity sensor. In addition, it is possible to reduce the temperature hysteresis resulting from heating processing such as attachment on a circuit substrate or a package by optimizing the elastic modulus e of the bonding material that attaches the sensor element on the circuit element to satisfy 2.0 GPa<e<7.8 GPa.

Application Example 17

In the physical quantity sensor according to the application example, 2.0 GPa<e≤7.5 GPa may be satisfied.

According to this application example, it is possible to further reduce the temperature hysteresis resulting from heating processing such as attachment on a circuit substrate or a package by further optimizing the elastic modulus e of the bonding material that attaches the sensor element on the circuit element to satisfy 2.0 GPa<e≤7.5 GPa.

Application Example 18

In the physical quantity sensor according to the application example, it is preferable that 2.5 GPa≤e≤7.0 GPa is satisfied.

According to this application example, it is possible to further preferably reduce the temperature hysteresis resulting from heating processing such as attachment on a circuit substrate or a package by further optimizing the elastic modulus e of the bonding material that attaches the sensor element on the circuit element to satisfy 2.5 GPa<e≤7.0 GPa.

Application Example 19

In the physical quantity sensor according to the application example, it is preferable that 3.4 GPa≤e≤6.0 GPa is satisfied.

According to this application example, it is possible to particularly preferably reduce the temperature hysteresis resulting from heating processing such as attachment on a circuit substrate or a package by further optimizing the elastic modulus e of the bonding material that attaches the sensor element on the circuit element to satisfy 3.4 GPa<e≤6.0 GPa.

Application Example 20

In the physical quantity sensor according to the application example, it is preferable that a glass transition temperature of the bonding material is outside an operation temperature range of the sensor element.

According to this application example, since the glass transition temperature (Tg) of the bonding material that attaches the sensor element on the circuit element is outside the operation temperature range of the sensor element, the physical properties of the bonding material hardly changes within the operation temperature range, and thereby, it is possible to further stabilize the temperature characteristics of the sensor element.

Application Example 21

In the physical quantity sensor according to the application example, it is preferable that a thickness of the bonding material is less than 50 μm.

According to this application example, by setting the thickness of the bonding material that attaches the sensor element on the circuit element to less than 50 μm, it is possible to reduce influence on the characteristics of the sensor element due to the changes in the physical properties of the bonding material resulting from heating processing and the like.

Application Example 22

In the physical quantity sensor according to the application example, it is preferable that the substrate is formed of any one of ceramics, glass, silicon, resin, and metal.

According to this application example, a container physical quantity sensor can be formed of easily available general materials.

Application Example 23

In the physical quantity sensor according to the application example, it is preferable that the sensor element is an acceleration sensor element.

According to this application example, it is possible obtain acceleration data with reduced temperature hysteresis resulting from heating processing such as attachment on a circuit substrate or a package.

Application Example 24

A complex sensor according to this application example includes: the physical quantity sensor according to the application examples and an angular velocity sensor element.

According to this application example, the complex sensor can be easily configured, and for example, acceleration data or angular velocity data may be obtained.

Application Example 25

An inertial measurement unit according to this application example includes: the physical quantity sensor according to any one of application examples; an angular velocity sensor; and a control unit that controls the physical quantity sensor and the angular velocity sensor.

According to this application example, it is possible to provide an inertial measurement unit with higher reliability by the physical quantity sensor with reduced temperature hysteresis caused by heating processing.

Application Example 26

A portable electronic device according to this application example includes: the physical quantity sensor according to any one of application examples; a case in which the physical quantity sensor is stored; a processing unit that is stored in the case and processes output data from the physical quantity sensor; a display portion stored in the case; and a light-transmissive cover that covers an opening portion of the case.

According to this application example, it is possible to provide a portable electronic device with higher control reliability by the output data of the physical quantity sensor with reduced temperature hysteresis caused by heating processing.

Application Example 27

An electronic device according to this application example includes: the physical quantity sensor according to any one of application examples; and a control unit that performs control based on a measurement signal output from the physical quantity sensor.

According to this application example, it is possible to provide an electronic device with higher control reliability by the measurement signal of the physical quantity sensor with reduced temperature hysteresis caused by heating processing.

Application Example 28

A vehicle according to this application example includes: the physical quantity sensor according to any one of application examples; and an attitude control unit that performs control of an attitude based on a measurement signal output from the physical quantity sensor.

According to this application example, it is possible to provide a highly reliable vehicle in which the reliability of attitude control is improved by the measurement signal of the physical quantity sensor with reduced temperature hysteresis caused by heating processing.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a physical quantity sensor, an inertial measurement unit, an electronic device, and a vehicle according to the invention will be described in detail based on the embodiments illustrated in attached drawings. The embodiments described below do not unduly limit the contents of the invention described in the appended claims. In addition, all of the configurations described in the present embodiments are not necessarily indispensable constitutional requirements of the invention.

First Embodiment

Figure 1:
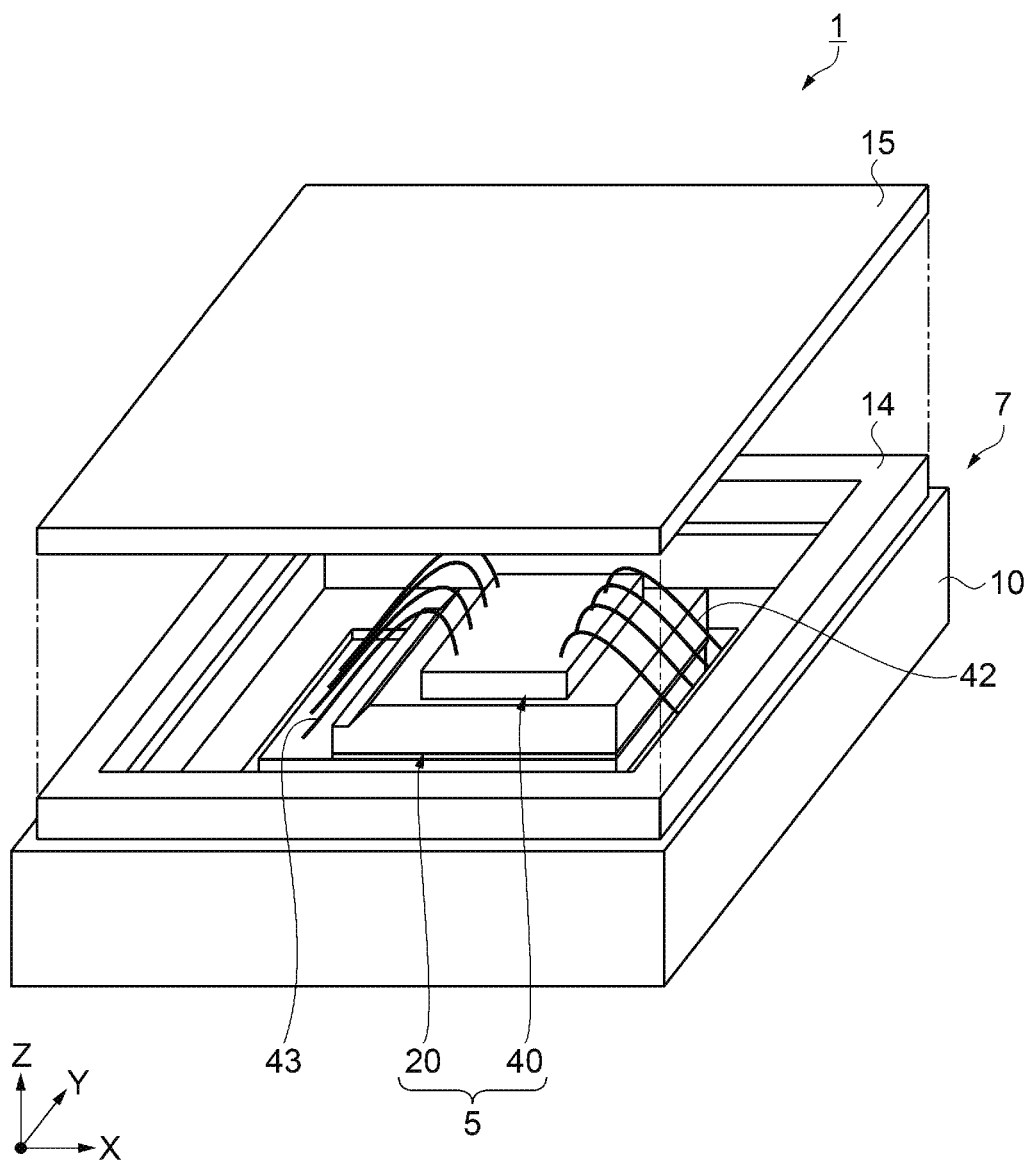
FIG. 1 is a perspective view illustrating a schematic configuration of a physical quantity sensor according to a first embodiment.
Figure 2A:
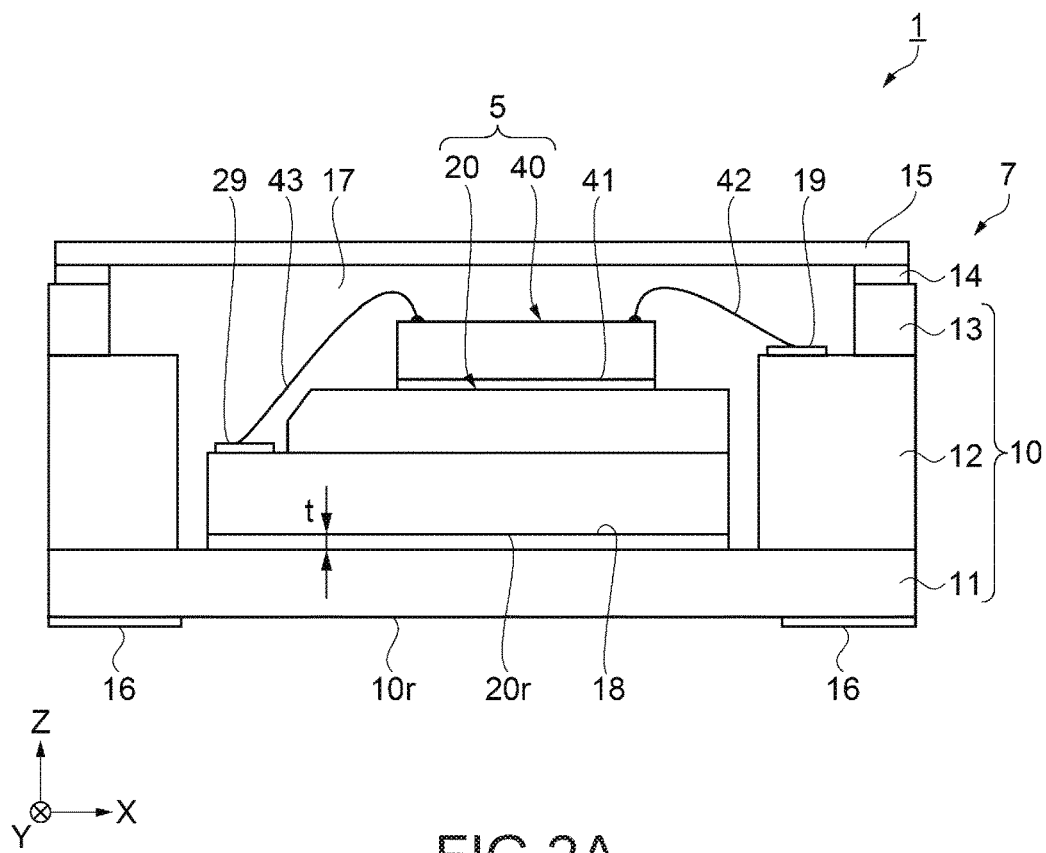
FIG. 2A is a sectional view illustrating a schematic configuration of the physical quantity sensor.
Figure 2B:
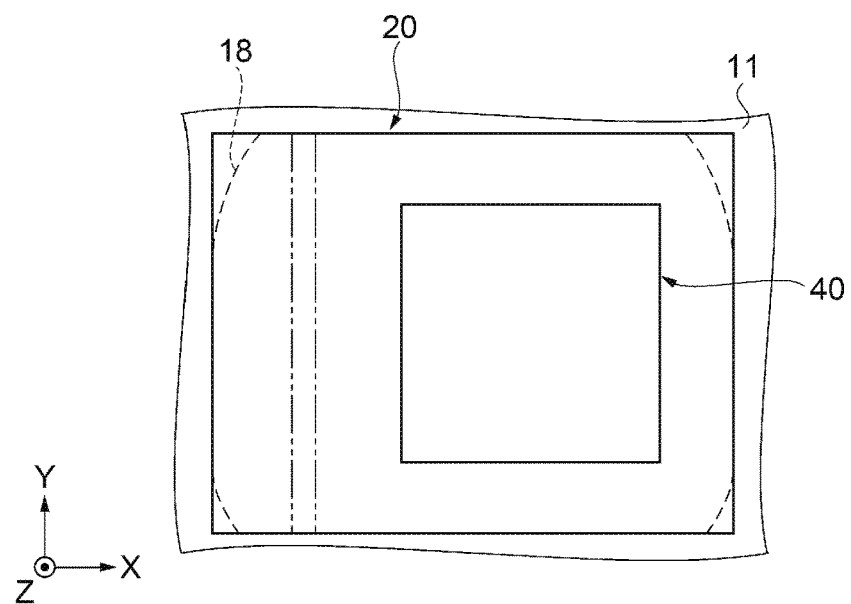
FIG. 2B is a plan view illustrating an attached state of a sensor element.
Figure 3:
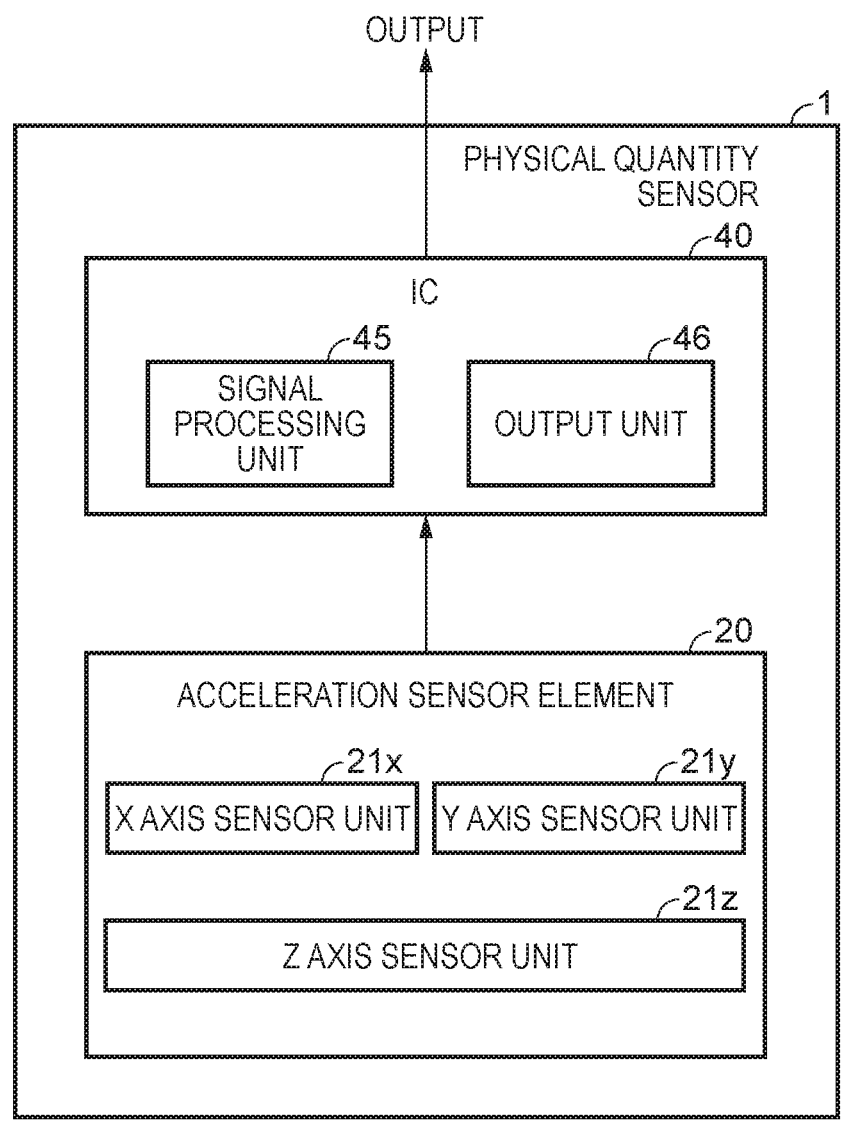
FIG. 3 is a functional block diagram of the physical quantity sensor.
Figure 4:
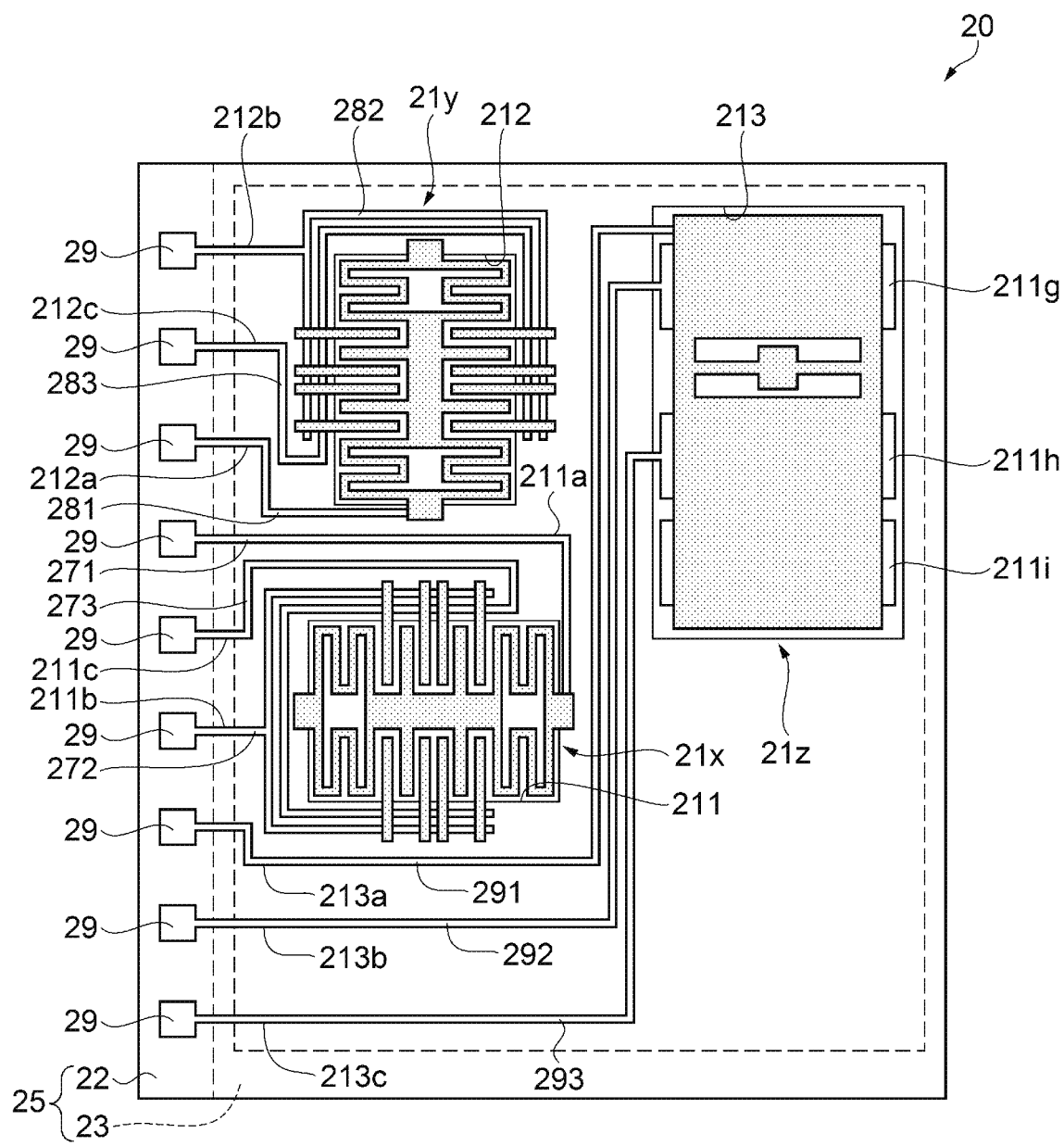
FIG. 4 is a plan view illustrating a disposal example of sensor elements used for the physical quantity sensor.
Figure 5:
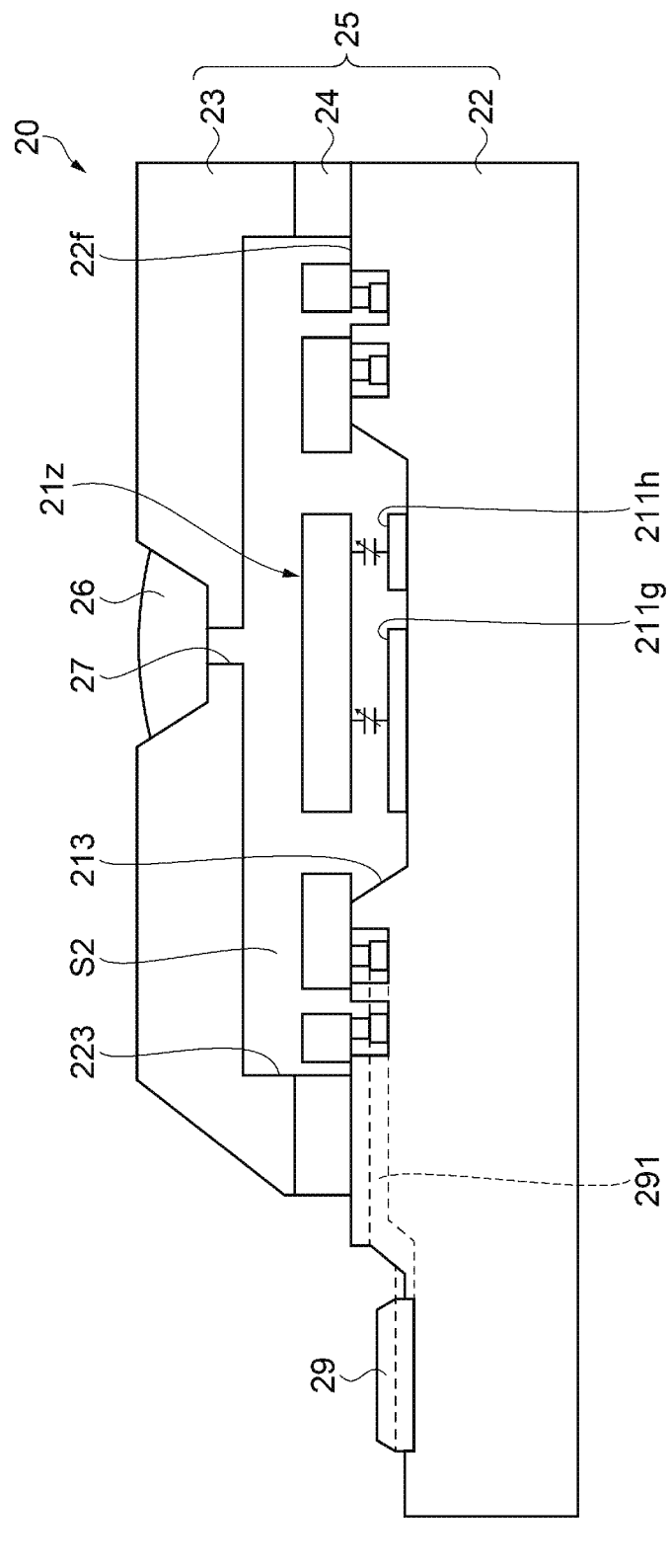
FIG. 5 is a sectional view illustrating a schematic configuration of the sensor element.
Figure 6A:
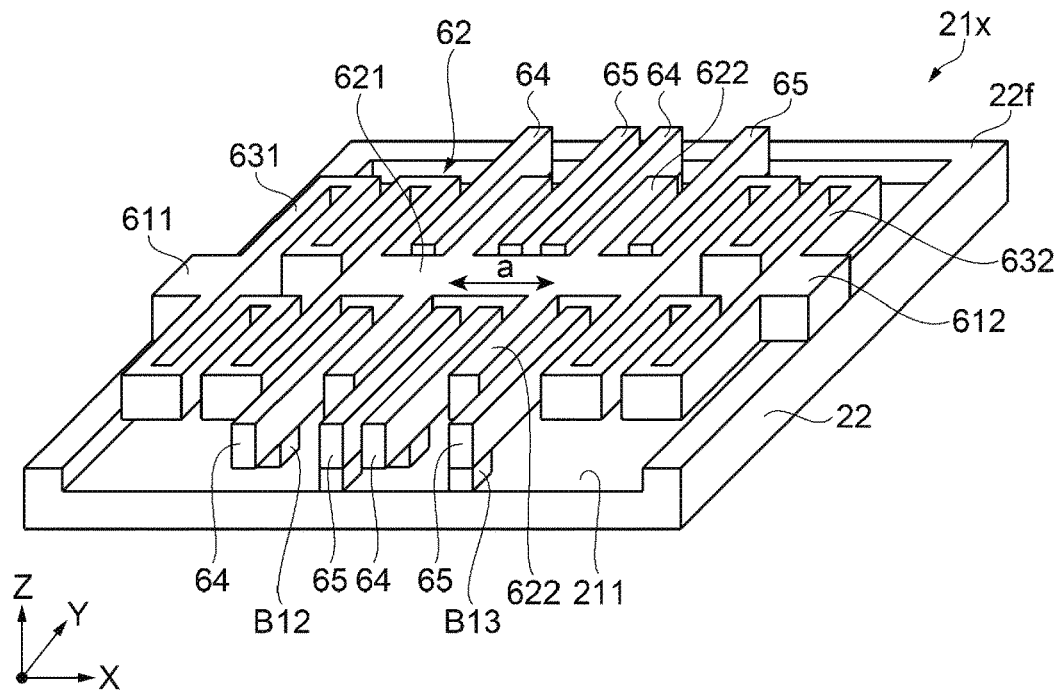
FIG. 6A is a perspective view illustrating a schematic configuration of a sensor unit (X axis direction measurement) of the sensor element.
Figure 6B:
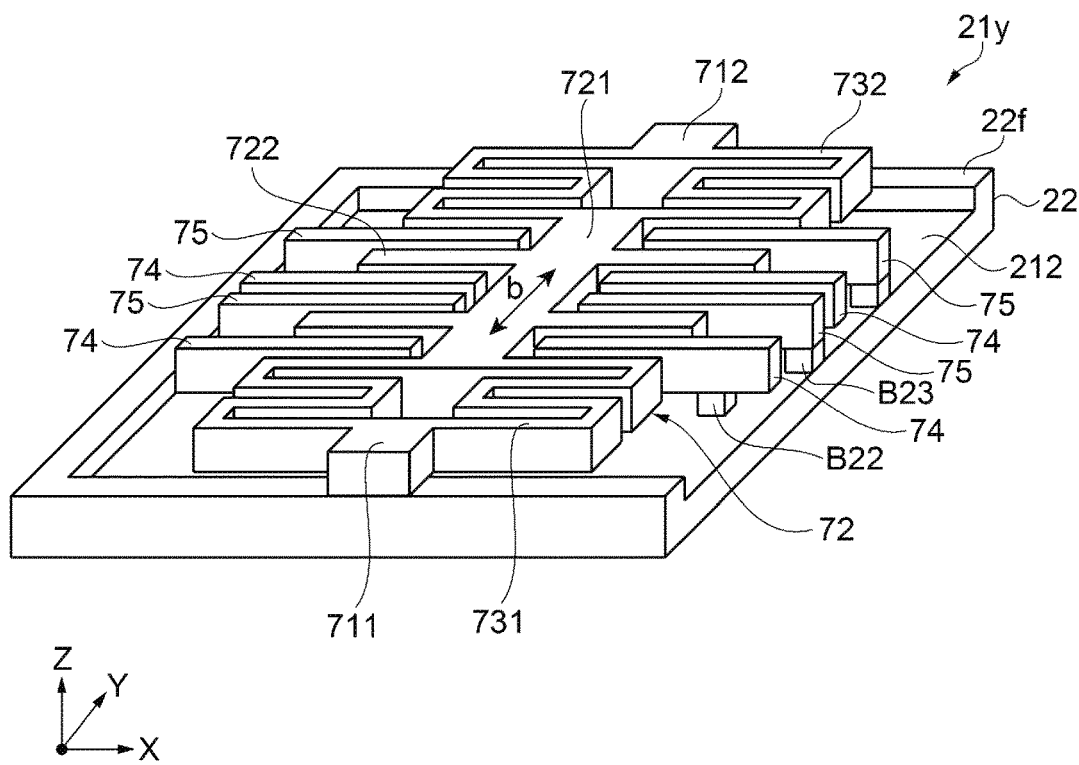
FIG. 6B is a perspective view illustrating a schematic configuration of a sensor unit (Y axis direction measurement) of the sensor element.
Figure 6C:
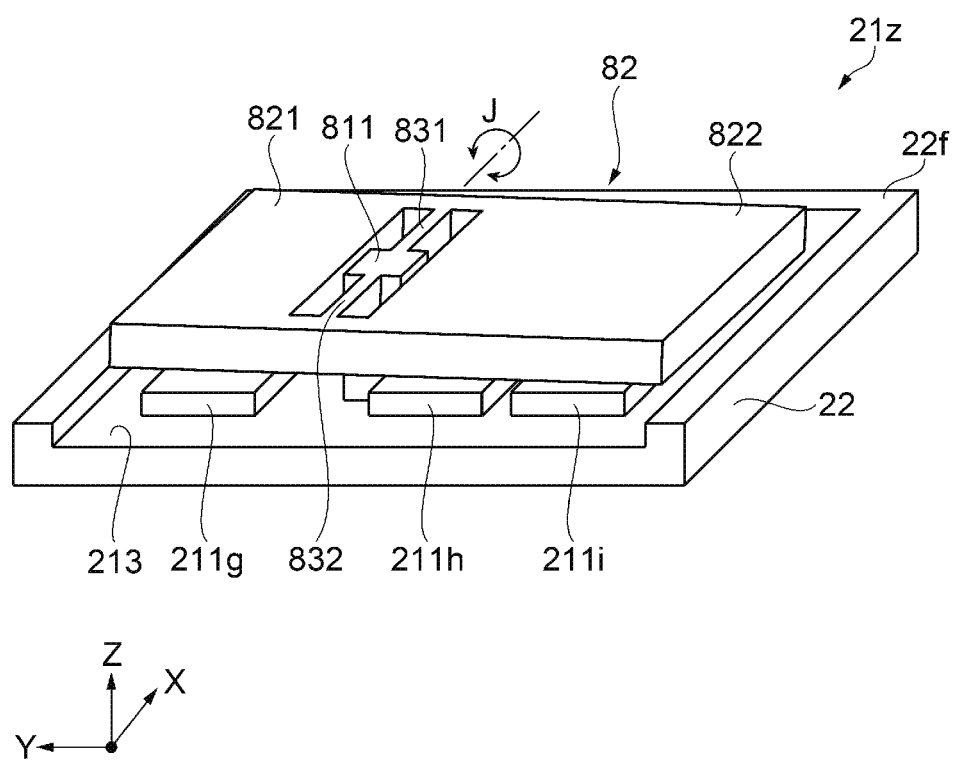
FIG. 6C is a perspective view illustrating a schematic configuration of a sensor unit (Z axis direction measurement) of the sensor element.

A physical quantity sensor according to a first embodiment will be described with reference to FIGS. 1, 2A, 2B, 3, 4, 5, 6A, 6B, and 6C. FIG. 1 is a perspective view illustrating a schematic configuration of a physical quantity sensor according to the first embodiment. FIG. 2A is a sectional view illustrating a schematic configuration of the physical quantity sensor. FIG. 2B is a plan view illustrating an attached state of a sensor element. FIG. 3 is a functional block diagram of the physical quantity sensor. FIG. 4 is a plan view illustrating a disposal example of sensor elements used for the physical quantity sensor. Furthermore, for the sake of convenience of explanation, a lid is omitted in FIG. 4. FIG. 5 is a sectional view illustrating a schematic configuration of the sensor element. FIG. 6A is a perspective view illustrating a schematic configuration of a sensor unit (X axis direction measurement) of the sensor element. FIG. 6B is a perspective view illustrating a schematic configuration of a sensor unit (Y axis direction measurement) of the sensor element. FIG. 6C is a perspective view illustrating a schematic configuration of a sensor unit (Z axis direction measurement) of the sensor element.

Hereinafter, the three axes orthogonal to each other are described as an X axis, a Y axis, and a Z axis, as described in each drawing. A direction parallel to the X axis is referred to as an "X axis direction", a direction parallel to the Y axis is referred to as a "Y axis direction", and a direction parallel to the Z axis is referred to as a "Z axis direction". A plane including the X axis and the Y axis along a direction in which three sensor units are disposed is referred to as an "XY plane". As the Z axis direction, a direction along a stack (disposal) direction of a base substrate and a lid constituting a package, in other words, a direction along an attachment direction (stack direction) of a sensor element and the base substrate is defined as the Z axis direction. Furthermore, for the sake of convenience of explanation, a surface on a side in a +Z axis direction which is a side of the lid may be referred to as an upper surface, and a surface on a side in a −Z axis direction which is opposite to the +Z axis direction may be referred to as a lower surface, in a plan view seen from the Z axis direction.

A physical quantity sensor 1 illustrated in FIGS. 1, 2A, and 3 can be used as a 3-axis acceleration sensor that can independently measure acceleration in the X axis direction, the Y axis direction, and the Z axis direction, respectively. Such a physical quantity sensor 1 includes a package 7 and a structure body 5 stored in the package 7. The structure body 5 includes an acceleration sensor element 20 as a sensor element and an integrated circuit (IC) 40 as a circuit element disposed on the acceleration sensor element 20, and a lower surface 20r of the acceleration sensor element 20 is connected to inside (storage space 17) of the package 7 by a resin adhesive 18 as a bonding material.

Package 7

As illustrated in FIGS. 1, 2A and 2B, the package 7 includes a base portion 10 configured with a first base material 11, a second base material 12, and a third base material 13, and a lid 15 connected to the third base material 13 via a sealing member 14. The first base material 11, the second base material 12, and the third base material 13 are stacked in this order to configure the base portion 10. The first base material 11 has a flat plate shape, the second base material 12 and the third base material 13 are annular substrates from which a central portion is removed, and the sealing member 14 such as a seal ring or a low melting point glass is formed on a peripheral edge of an upper surface of the third base material 13. The base portion 10 configured with the first base material 11, the second base material 12 and the third base material 13 correspond to a substrate.

In the package 7, a recess portion (cavity) in which the structure body 5 is stored is formed by the second base material 12 and the third base material 13 that are annular substrates from which a central portion is removed. The package 7 is provided with a storage space (internal space) 17 that is an enclosed space in which an opening of the recess portion (cavity) is covered by the lid 15, and thereby the structure body 5 can be stored in the storage space 17. By storing the structure body 5 configured with the acceleration sensor element 20 and the IC 40 in the storage space 17 provided between the package 7 and the lid 15, the compact physical quantity sensor 1 with high performance can be obtained. A part of an electrode pad (terminal electrode) and a wiring pattern formed in the base portion 10 including the first base material 11 and the second base material 12 are not illustrated.

Ceramics or the like is suitably used for the constituent materials of the first base material 11, the second base material 12, and the third base material 13. Glass, resin, metal, and the like can be used for the constituent materials of the first base material 11, the second base material 12, and the third base material 13 in addition to ceramics. For example, a metallic material such as Kovar, a glass material, a silicon material, a ceramic material, and a resin material may be used for the constituent material of the lid 15.

A plurality of internal terminals 19 are disposed on an upper surface of the second base material 12, and a plurality of external terminals 16 are disposed on an outer bottom surface 10r of the package 7 which is a lower surface of the first base material 11. Each internal terminal 19 is electrically connected to the corresponding external terminal 16 via an internal wiring (not illustrated) and the like formed in the base portion 10.

Structure Body 5

The structure body 5 includes the acceleration sensor element 20, and the IC 40 as a circuit element connected to the acceleration sensor element 20 by an adhesive layer 41. In other words, the IC 40 is attached on a surface of the acceleration sensor element 20 on the side opposite to the lower surface 20r which is the surface on the side of the first base material 11 constituting the package 7. It is possible to increase the disposal efficiency in the plane direction and to reduce the area of the physical quantity sensor 1 in the plan view, by stacking the package 7, the acceleration sensor element 20, and the IC 40.

As illustrated in FIGS. 2A and 2B, the lower surface 20r of the acceleration sensor element 20 of the structure body 5 is connected to an upper surface of the first base material 11 constituting the base portion 10 as a substrate by the resin adhesive 18 as a bonding material, and the structure body 5 is stored in the storage space 17 of the package 7. It is preferable that thickness t (see FIG. 2A) of the resin adhesive 18 is less than 50 μm, and a ratio of an area covered with the resin adhesive 18 with respect to the area where the acceleration sensor element 20 and the package 7 (first base material 11) overlap in a plan view from the Z axis direction, that is, a bonding area (area illustrated by broken line in FIG. 2B), is higher than or equal to 80%. The storage space 17 of the package 7 is airtightly sealed in a reduced pressure atmosphere lower than atmospheric pressure or in an inert gas atmosphere such as nitrogen, argon, and helium.

Resin Adhesive 18

Since the physical properties of the resin adhesive 18 as a bonding material that connects the structure body 5 to the base portion 10 after curing has an influence on the characteristics of the acceleration sensor element 20, it is important to select the elastic modulus and glass transition point and the like appropriately.

The acceleration sensor element 20 which will be described with reference to FIGS. 4 to 6C in the paragraphs below includes an X axis sensor unit 21x, a Y axis sensor unit 21y, and a Z axis sensor unit 21z. In the acceleration sensor element 20 connected to the base portion 10, deformation such as warpage may be generated in a container 25 due to the stress resulting from heating or cooling. Fluctuation is generated in the electrostatic capacitance generated between the electrodes of the X axis sensor unit 21x, the Y axis sensor unit 21y, and the Z axis sensor unit 21z bonded in the container 25 due to the warpage of the container 25, and thereby measurement accuracy may be affected.

Figure 7:
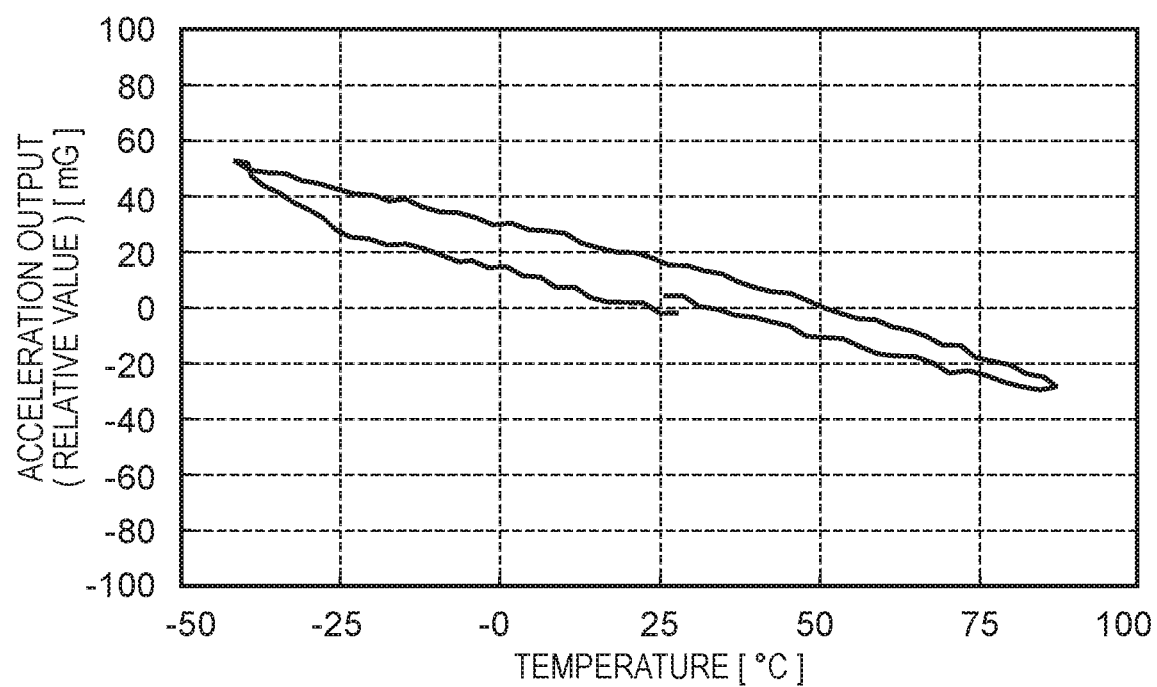
FIG. 7 is a graph illustrating temperature hysteresis according to an output signal.

The influence in the measurement accuracy notably appears as so-called temperature hysteresis deterioration indicating restorability of output property (output in a state where acceleration is not applied: temperature characteristics of 0 G bias) in each temperature at the time of temperature increase and temperature decrease, particularly, as illustrated in FIG. 7. FIG. 7 is a graph that explains the temperature hysteresis according to the output signal, and illustrates an example where a remarkable temperature hysteresis is generated. In the graph, a vertical axis indicates acceleration output in an absolute value, a horizontal axis indicates measurement temperature, and changes in the acceleration output signal at the time of temperature increase and the acceleration output signal at the time of temper decrease within a range of −40° C. to +85° C. are illustrated. Here, the temperature hysteresis indicates the difference in the signal output when raised and lowered when increasing and decreasing the temperature within a use temperature range (−40° C. to +85° C.)

The inventors of the present application focused on the physical properties of the resin adhesive 18 after curing. As a result of diligent examination, evaluation, analysis and confirmation work on the bonding material, the inventors found that it is possible to exhibit, for example, improvement effect of the temperature hysteresis as illustrated in FIGS. 8A and 8B by setting the value of the elastic modulus of the resin adhesive 18 after curing to the following numerical value range.

Figures 8A, 8B, 9:
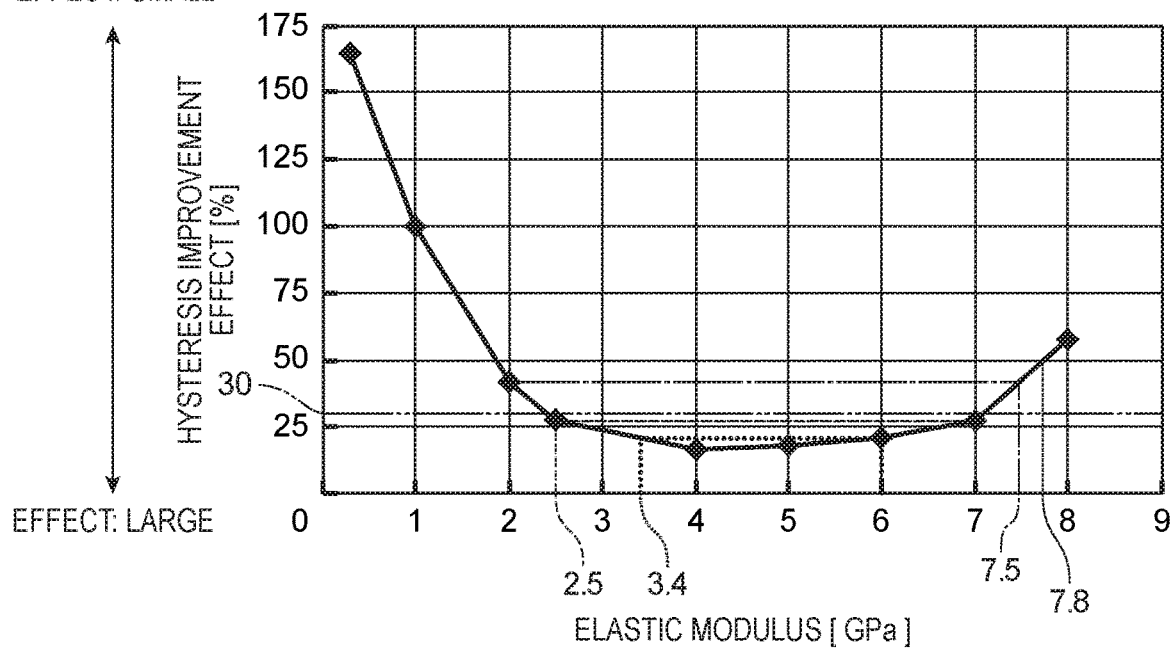
FIG. 8A is a table illustrating improvement effect of the temperature hysteresis.
FIG. 8B is a graph illustrating the improvement effect of the temperature hysteresis.
FIG. 9 is a table illustrating evaluation results of bonding materials used for the sensor element.

FIGS. 8A and 8B are evaluation results on the improvement effect of the temperature hysteresis with reference to an adhesive B (elastic modulus e=1.0 GPa) illustrated in FIG. 9. FIG. 8A is a table illustrating improvement effect of the temperature hysteresis. FIG. 8B is a graph illustrating the improvement effect of the temperature hysteresis, and is a graph of the table illustrated in FIG. 8A.

As illustrated in FIGS. 8A and 8B,
a) when the elastic modulus of the resin adhesive 18 after curing is e, with 2.0 GPa<e<7.8 GPa, the hysteresis value is less than or equal to 50% with reference to 1 GPa of the adhesive B;
b) with 2.0 GPa<e≤7.5 GPa, the hysteresis value is less than or equal to 50% with reference to 1 GPa of the adhesive B;
c) with 2.5 GPa≤e≤7.0 GPa, the hysteresis value is less than or equal to 30% with reference to 1 GPa of the adhesive B; and
d) with 3.4 GPa≤e≤6.0 GPa, the hysteresis value is less than or equal to 25% with reference to 1 GPa of the adhesive B.

From the above-described results, it is considered that the thermal responsiveness (creep and the like) of the resin adhesive 18 itself becomes a factor of deteriorating characteristics because the amount of deformation due to heat is large on the low elasticity side where the elastic modulus e is small, and the adhesion portion is broken and the adhesive strength is lowered because an excessive stress is accumulated in the adhesion portion between the adherend (package 7 and acceleration sensor element 20) and the adhesive on the high elasticity side where the elastic modulus e is large. This is verified because the electrical characteristics deteriorate (temperature hysteresis increases) as the adhesive strength decreases. That is, it is found that even if the elastic modulus e is high, the zero G bias temperature characteristics do not become a problem in practical use as long as the adhesive strength can be maintained.

In the conformation work, as illustrated in FIG. 9, the acceleration sensor element 20 adhered to the package 7 using various adhesives A to I with different physical properties (elastic modulus e) after curing and was evaluated for adhesive strength and zero G bias temperature characteristics. The adhesive A has a small elastic modulus e of 0.03 and is in a soft cured state. The elastic modulus e increases sequentially from the adhesive B toward the adhesive I, and the adhesive I shows the elastic modulus e=8. FIG. 9 is a table illustrating evaluation results of bonding materials used for the sensor element.

The evaluation results in the table illustrated in FIG. 9 are determined as "Good" in a case where all the results can be used without any problems, "B/P (barely passed)" in a case where the results are unstable for use, and "N/A (not acceptable)" in a case where it is unusable because there is a problem in temperature hysteresis or adhesive strength.

As illustrated in FIG. 9, in the evaluation of the zero G bias temperature characteristics, the zero G bias temperature characteristics of the adhesive A and the adhesive B are deteriorated to the extent that it cannot withstand the use (determination "N/A"). The zero G bias temperature characteristics of the adhesive C and the adhesive I were determined as unstable for use (determination "B/P"). The adhesives D to H were determined as usable without any problems (determination "Good").

As a result of the above-described results, the temperature hysteresis can be reduced by setting the resin adhesive 18 after curing to have the following physical properties.

1) It is preferable that the elastic modulus e of the resin adhesive 18 after curing is larger than 2.0 GPa less than 7.8 GPa. By setting the elastic modulus e of the resin adhesive 18 after curing to be such a value, it is possible to reduce the temperature hysteresis generated due to the heating processing when, for example, mounting or attaching the physical quantity sensor 1 on a circuit substrate (not illustrated) or to other storage containers (not illustrated).

2) It is further preferable that the elastic modulus e of the resin adhesive 18 after curing is larger than 2.0 GPa and less than or equal to 7.5 GPa. By setting the elastic modulus e of the resin adhesive 18 after curing to be such a value, it is possible to further reduce the temperature hysteresis generated due to the heating processing when, for example, mounting or attaching the physical quantity sensor 1 on a circuit substrate (not illustrated) or to other storage containers (not illustrated).

3) Furthermore, it is preferable that the elastic modulus e of the resin adhesive 18 after curing satisfies greater than or equal to 2.5 GPa and less than or equal to 7.0 GPa. By setting the elastic modulus e of the resin adhesive 18 after curing to be such a value, it is possible to further preferably reduce the temperature hysteresis generated due to the heating processing when, for example, mounting or attaching the physical quantity sensor 1 on a circuit substrate (not illustrated) or to other storage containers (not illustrated).

4) It is particularly preferable that the elastic modulus e of the resin adhesive 18 after curing satisfies 3.4 GPa e 6.0 GPa. By setting the elastic modulus e of the resin adhesive 18 after curing to be such a value, it is possible to particularly preferably reduce the temperature hysteresis generated due to the heating processing when, for example, mounting or attaching the physical quantity sensor 1 on a circuit substrate (not illustrated) or to other storage containers (not illustrated).

5) It is preferable that the glass transition temperature (Tg) of the resin adhesive 18 is outside the operation temperature range of the acceleration sensor element 20. Since the glass transition temperature (Tg) of the resin adhesive 18 is outside the operation temperature range of the acceleration sensor element 20, and there is no singular point related to the physical properties of the resin adhesive 18 within the operation temperature range, the physical properties of the resin adhesive 18 hardly change, it is possible to further stabilize the temperature characteristics (temperature hysteresis) of the acceleration sensor element 20.

6) It is preferable that the thickness t of the resin adhesive 18 (see FIG. 2B) is less than 50 μm. By setting the thickness of the resin adhesive 18 to less than 50 μm, generation of stress due to characteristic changes is small with the thin resin adhesive 18 even if the physical properties of the resin adhesive 18 change by heating processing and the like, and it is possible to reduce the influence to the characteristic of the acceleration sensor element 20.

7) It is preferable that the ratio of an area covered with the resin adhesive 18 with respect to the area where the acceleration sensor element 20 and the package 7 (first base material 11) overlap in a plan view from the Z axis direction, that is, a bonding area (area illustrated by broken line in FIG. 2B), is higher than or equal to 80%. The larger the bonding area of the resin adhesive 18 is, the more stable the bonding state of the acceleration sensor element 20 to the package 7 becomes. Accordingly, the variations of the characteristics of the acceleration sensor element 20 can be reduced, and it is possible to stabilize the characteristics of the acceleration sensor element 20 by particularly setting the ratio of the bonding area of the resin adhesive 18 to higher than or equal to 80%.

As illustrated in FIG. 3, the acceleration sensor element 20 includes the X axis sensor unit 21*x*, the Y axis sensor unit 21*y*, and the Z axis sensor unit 21*z* each of which can measure acceleration in the X axis direction, the Y axis direction, and the Z axis direction independently as a functional configuration of the physical quantity sensor 1. The X axis sensor unit 21*x* and the Y axis sensor unit 21*y* measures an acceleration of two axes in an XY plane direction (X axis direction and Y axis direction), the Z axis sensor unit 21*z* measures an acceleration in the Z axis direction orthogonal to the XY plane direction, and the measured data is transmitted to the IC 40 as a signal indicating data of change in electrostatic capacitance. The IC 40 includes a signal processing unit 45 and an output unit 46. The IC 40 converts the signal indicating change in the electrostatic capacitance sent from the acceleration sensor element 20 to a user friendly format, for example, a bias method by the signal processing unit 45, and outputs the signal from the output unit 46 as acceleration data.

The acceleration sensor element 20 and the IC 40 constituting the structure body 5 are electrically connected by the bonding wire 43. The IC 40 is electrically connected to the internal terminal 19 provided in the package 7 (upper surface of second base material 12) by the bonding wire 42. The internal terminal 19, and the external terminal 16 may be formed by a method in which a metal wiring material such as tungsten (W) and molybdenum (Mo) is screen-printed at a predetermined position and baked, and plating nickel (Ni), gold (Au) or the like is applied thereon.

Acceleration Sensor Element 20

As illustrated in FIGS. 4 and 5, the acceleration sensor element 20 as a sensor element includes the container 25 including a base substrate 22 and a cap (lid portion) 23 and three sensor units of the X axis sensor unit 21*x*, the Y axis sensor unit 21*y*, and the Z axis sensor unit 21*z* stored in the container 25. Furthermore, for the sake of convenience of explanation, only Z axis sensor unit 21*z* is illustrated in FIG. 5.

The recess portions 211, 212, and 213 opening to upper side are formed on the base substrate 22. Among these, the recess portion 211 functions as a relief portion for preventing contact between the X axis sensor unit 21*x* disposed thereabove and the base substrate 22. Similarly, the recess portion 212 functions as a relief portion for preventing contact between the Y axis sensor unit 21*y* disposed thereabove and the base substrate 22. The recess portion 213 functions as a relief portion for preventing contact between the Z axis sensor unit 21*z* disposed thereabove and the base substrate 22.

In addition, recess portions 211*a*, 211*b*, and 211*c*, recess portions 212*a*, 212*b*, and 212*c*, and recess portions 213*a*, 213*b*, and 213*c* opening to an upper surface are formed on the base substrate 22. Among these, the recess portions 211*a*, 211*b*, and 211*c* are disposed around the recess portion 211, and wirings 271, 272, and 273 for the X axis sensor unit 21*x* are disposed in these recess portions 211*a*, 211*b*, and 211*c*. The recess portions 212*a*, 212*b*, and 212*c* are disposed around the recess portion 212 and wirings 281, 282, and 283 for the Y axis sensor unit 21*y* are disposed in the recess portions 212*a*, 212*b*, and 212*c*. The recess portions 213*a*, 213*b*, and 213*c* are disposed around the recess portion 213 and wirings 291, 292, and 293 for the Z axis sensor unit 21*z* are disposed in the recess portions 213*a*, 213*b*, and 213*c*. Each end of these wirings 271, 272, 273, 281, 282, 283, 291, 292, and 293 is exposed to the outside of the container 25, and the exposed part thereof is a connection terminal 29. Each connection terminal 29 is electrically connected to an electrode pad (not illustrated) of the IC 40 via the bonding wire 43.

Such a base substrate 22 is formed of, for example, a glass material (borosilicate glass such as Pyrex (registered trademark) glass, for example) including an alkali metal ion (mobile ion). Accordingly, the X axis sensor unit 21*x*, the Y axis sensor unit 21*y*, and the Z axis sensor unit 21*z* formed of a silicon substrate can be firmly bonded with the base substrate 22 by anodic bonding. Since light transmittance can be imparted to the base substrate 22, the inner portion of the container 25 can be observed through the base substrate 22. However, a constituent material of the base substrate 22 is not limited to a glass material, and a silicon material with high resistance can be used, for example. In this case, the bonding of the X axis sensor unit 21*x*, the Y axis sensor unit 21*y*, and the Z axis sensor unit 21*z* can be performed via direct bonding, siloxane bonding, a resin type adhesive, glass paste, a metal layer or the like, for example.

The X axis sensor unit 21*x* which is one of the sensor units is a portion that measures the acceleration in the X axis direction. As illustrated in FIG. 6A, such an X axis sensor unit 21*x* includes support portions 611 and 612, a movable portion 62, coupling portions 631 and 632, a plurality of first fixed electrode fingers 64, and a plurality of second fixed electrode fingers 65. The movable portion 62 includes a base 621 and a plurality of movable electrode fingers 622 projecting from both sides in the Y axis direction from the base 621. Such an X axis sensor unit 21*x* is formed of a silicon substrate doped with impurities such as phosphorus and boron, for example, and has conductivity.

The support portions 611 and 612 are anodically bonded with an upper surface 22*f* of the base substrate 22, and the support portion 611 is electrically connected to a wiring 271 via a conductive bump (not illustrated). The movable portion 62 is provided between these support portions 611 and 612. The movable portion 62 is coupled with the support portions 611 and 612 via coupling portions 631 and 632. Since the coupling portions 631 and 632 are elastically deformable like a spring in the X axis direction, the movable portion 62 can be displaced in the X axis direction as indicated by an arrow a with respect to the support portions 611 and 612.

The plurality of first fixed electrode fingers 64 are disposed on one side of the movable electrode fingers 622 in the X axis direction, and are lined up in a comb teeth shape meshing with the corresponding movable electrode fingers 622 with an interval therebetween. The plurality of first fixed electrode fingers 64 are anodically bonded with an upper surface of the recess portion 211 of the base substrate 22 at a base end portion thereof, and are electrically connected to the wiring 272 via a conductive bump B12.

The plurality of second fixed electrode fingers 65 are disposed on the other side of the movable electrode fingers 622 in the X axis direction, and are lined up in a comb teeth shape meshing with the corresponding movable electrode fingers 622 with an interval therebetween. The plurality of second fixed electrode fingers 65 are anodically bonded with the upper surface 22f of the base substrate 22 at a base end portion thereof, and are electrically connected to the wiring 273 via a conductive bump B13.

The acceleration in the X axis direction is measured as follows using such an X axis sensor unit 21x. That is, when acceleration is applied in the X axis direction, the movable portion 62 is displaced in the X axis direction while elastically deforming the coupling portions 631 and 632 based on the magnitude of the acceleration. With this displacement, each magnitude of electrostatic capacitance between the movable electrode finger 622 and the first fixed electrode finger 64 and electrostatic capacitance between the movable electrode fingers 622 and the second fixed electrode finger 65 changes. The acceleration is obtained by the IC 40 based on the change in the corresponding electrostatic capacitance.

The Y axis sensor unit 21y which is one of the sensor units is a portion that measures the acceleration in the Y axis direction. The Y axis sensor unit 21y has the same configuration with the X axis sensor unit 21x except that it is disposed in a state rotated 90° in the plan view. As illustrated in FIG. 6B, the Y axis sensor unit 21y includes support portions 711 and 712, a movable portion 72, coupling portions 731 and 732, a plurality of first fixed electrode fingers 74, and a plurality of second fixed electrode fingers 75. The movable portion 72 includes a base 721, and a plurality of movable electrode fingers 722 projecting from both sides in the X axis direction from the base 721.

The support portions 711 and 712 are anodically bonded with the upper surface 22f of the base substrate 22, and the support portion 711 is electrically connected to a wiring 281 via a conductive bump (not illustrated). The movable portion 72 is provided between these support portions 711 and 712. The movable portion 72 is coupled with the support portions 711 and 712 via coupling portions 731 and 732. Since the coupling portions 731 and 732 are elastically deformable like a spring in the Y axis direction, the movable portion 72 can be displaced in the Y axis direction as indicated by an arrow b with respect to the support portions 711 and 712.

The plurality of first fixed electrode fingers 74 are disposed in one side of the movable electrode fingers 722 in the Y axis direction, and are lined up in a comb teeth shape meshing with the corresponding movable electrode fingers 722 with an interval therebetween. The plurality of first fixed electrode fingers 74 are anodically bonded with an upper surface of the recess portion 212 of the base substrate 22 at a base end portion thereof, and are electrically connected to wirings 282 via a conductive bump B22.

On the other hand, the plurality of second fixed electrode fingers 75 are disposed on the other side of the movable electrode fingers 722 in the Y axis direction, and are lined up in a comb teeth shape meshing with the corresponding movable electrode fingers 722 with an interval therebetween. The plurality of second fixed electrode fingers 75 are anodically bonded with the upper surface 22f of the base substrate 22 at a base end portion thereof, and are electrically connected to wirings 283 via a conductive bump B23.

The acceleration in the Y axis direction is measured as follows using such a Y axis sensor unit 21y. That is, when acceleration is applied in the Y axis direction, the movable portion 72 is displaced in the Y axis direction while elastically deforming the coupling portions 731 and 732 based on the magnitude of the acceleration. With this displacement, each magnitude of electrostatic capacitance between the movable electrode finger 722 and the first fixed electrode finger 74 and electrostatic capacitance between the movable electrode finger 722 and the second fixed electrode finger 75 changes. The acceleration is obtained by the IC 40 based on the change in the corresponding electrostatic capacitance.

The Z axis sensor unit 21z which is one of the sensor units is a portion that measures the acceleration in the Z axis direction (vertical direction). As illustrated in FIG. 6C, such a Z axis sensor unit 21z includes a support portion 811, a movable portion 82, and a pair of coupling portions 831 and 832 that rockably couples the movable portion 82 with the support portion 811, and the movable portion 82 rocks in a seesaw manner with respect to the support portion 811 with the coupling portions 831 and 832 as an axis J. Such a Z axis sensor unit 21z is formed of a silicon substrate doped with impurities such as phosphorus and boron, for example.

The support portion 811 is anodically bonded with the upper surface 22f of the base substrate 22, and the support portion 811 is electrically connected to a wiring 291 via a conductive bump (not illustrated). The movable portion 82 is provided on both sides of the support portion 811 in the Y axis direction. The movable portion 82 includes a first movable portion 821 that is positioned on a side in a +Y direction from the axis J and a second movable portion 822 that is positioned on a -Y direction from the axis J and is larger than the first movable portion 821. The first movable portion 821 and the second movable portion 822 have different rotational moments when acceleration is applied in the vertical direction (Z axis direction), and are designed so that a predetermined inclination is generated in the movable portion 82 according to the acceleration. When acceleration occurs in the Z axis direction, the movable portion 82 rocks in a seesaw manner with the axis J as a rotation axis.

A first measurement electrode (first fixed electrode) 211g electrically connected to a wiring 292 is disposed at a position facing the first movable portion 821 of a bottom surface of a recess portion 213, and a second measurement electrode (second fixed electrode) 211h electrically connected to a wiring 293 is disposed at position facing the second movable portion 822. Therefore, electrostatic capacitance is formed between the first movable portion 821 and the first measurement electrode 211g and between the second movable portion 822 and the second measurement electrode 211h. It is possible to provide a counter electrode (third fixed electrode) 211i at a position facing the second movable portion 822, and on the -Y axis side from the second measurement electrode 211h. It is preferable that the first measurement electrode 211g, the second measurement electrode 211h, and the counter electrode 211i are composed of a transparent conductive material such as ITO, for example. The counter electrode (third fixed electrode) 211i can be a dummy electrode.

The acceleration in the Z axis direction is measured as follows using such a Z axis sensor unit 21z. That is, when acceleration is applied in the Z axis direction, the movable portion 82 rocks in a seesaw manner with the axis J as a rotation axis. A separation distance between the first movable portion 821 and the first measurement electrode 211g and a separation distance between the second movable portion 822 and second measurement electrode 211h change by rocking of the movable portion 82 in a seesaw manner, and thereby, the electrostatic capacitance therebetween changes. The acceleration is obtained by the IC 40 based on the change in the corresponding electrostatic capacitance.

As illustrated in FIG. 5, the cap 23 has a recess portion 223 opening to a lower surface, and the recess portion 223 is bonded with the base substrate 22 to form an internal space S2 with recess portions 211, 212, and 213. Such a cap 23 is formed with a silicon substrate in the present embodiment. The cap 23 and the base substrate 22 are airtightly bonded using a glass frit (low melting point glass adhesive) 24. In a state where the cap 23 is bonded with the base substrate 22, the inside and the outside of the internal space S2 communicate with each other via the recess portions 211a to 211c, 212a to 212c, and 213a to 213c formed on the base substrate 22. Therefore, for example, the recess portions 211a to 211c, 212a to 212c, and 213a to 213c are covered by $SiO_2$ film (not illustrated) formed by CVD method using tetraethoxysilane (TEOS). In the cap 23, a stepped sealing hole 27 that penetrates from the recess portion 223 to outside is provided. The sealing hole 27 is sealed with a molten metal 26, for example, a melted gold-germanium alloy (AuGe) in a state where an internal space S2 is set to a nitrogen ($N_2$) atmosphere.

IC 40

As illustrated in FIG. 2A, IC 40 is disposed on an upper surface (on the cap 23) of the acceleration sensor element 20 via the adhesive layer 41. As the adhesive layer 41, the adhesive layer 41 is not particularly limited as long as the IC 40 can be fixed on the acceleration sensor element 20, and for example, solder, silver paste, resin adhesive (die attach material), or the like can be used.

The IC 40 includes, for example, a drive circuit that drives the acceleration sensor element 20, a measurement circuit (signal processing unit 45) that measures acceleration in each axis direction of the X axis, the Y axis and the Z axis based on the signal from the acceleration sensor element 20, and an output circuit (output unit 46) that converts a signal from the measurement circuit into a predetermined signal and outputs the signal. The IC 40 also includes a plurality of electrode pads (not illustrated) on an upper surface. Each electrode pad is electrically connected to the internal terminal 19 of the second base material 12 via the bonding wire 42 and each electrode pad is electrically connected to the connection terminal 29 of the acceleration sensor element 20 via the bonding wire 43. Accordingly, it is possible to control the acceleration sensor element 20.

According to the physical quantity sensor 1 according to the first embodiment, by optimizing the elastic modulus e of the resin adhesive 18 which is the bonding material that attaches the acceleration sensor element 20 to the package 7 as a substrate and setting the value to be higher than or equal to 1 GPa and less than 6 GPa, or higher than or equal to 1 GPa and less than 3 GPa, it is possible to reduce the temperature hysteresis of the output signal of the acceleration data resulting from heating processing such as attaching the physical quantity sensor 1 on a circuit substrate (not illustrated) or a package (not illustrated).

In the above-described first embodiment, in the acceleration sensor element 20 as a sensor element, an example of a configuration storing three sensor units of the X axis sensor unit 21x, the Y axis sensor unit 21y, and the Z axis sensor unit 21z in the container 25 is described. However, the three sensor units may not necessarily be stored in the acceleration sensor element, and can be an acceleration sensor element capable of measuring one axis or two axes according to the requirement of the use. Hereinafter, with reference to FIGS. 10 and 11, acceleration sensor elements of Application 1 and Application 2 will be described.

Application 1

Figure 10:
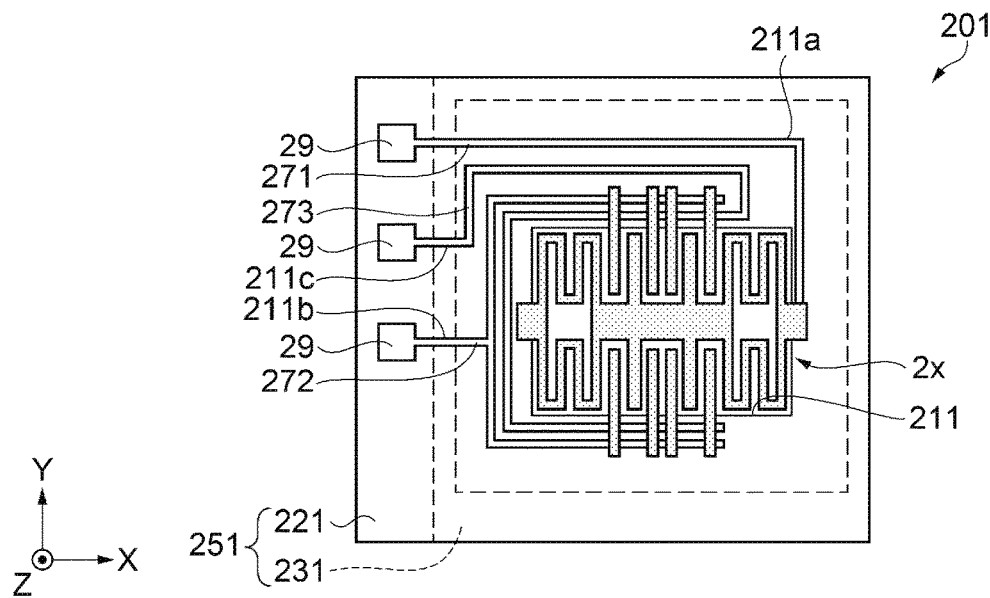
FIG. 10 is a plan view illustrating Application 1 of a sensor element.

First, Application 1 of the acceleration sensor element will be described with reference to FIG. 10. FIG. 10 is a plan view illustrating Application 1 of a sensor element.

As illustrated in FIG. 10, an acceleration sensor element 201 according to Application 1 includes a single sensor unit 2x. The sensor unit 2x is a portion that measures acceleration in an axis direction. Such a sensor unit 2x has the same configuration with the X axis sensor unit 21x described in FIGS. 4 and 6A. Therefore, a detailed description will be omitted. The sensor unit 2x is airtightly stored in the container 251 having the base substrate 221 and the cap 231 similar to the first embodiment. In such an acceleration sensor element 201, acceleration in one axis direction can be measured.

In the acceleration sensor element 201, the description is made using the sensor unit 2x having the same configuration with the X axis sensor unit 21x. However, a configuration that any similar sensor unit with the Y axis sensor unit 21y or the Z axis sensor unit 21z being airtightly stored in the container 251 may be adopted.

Application 2

Figure 11:
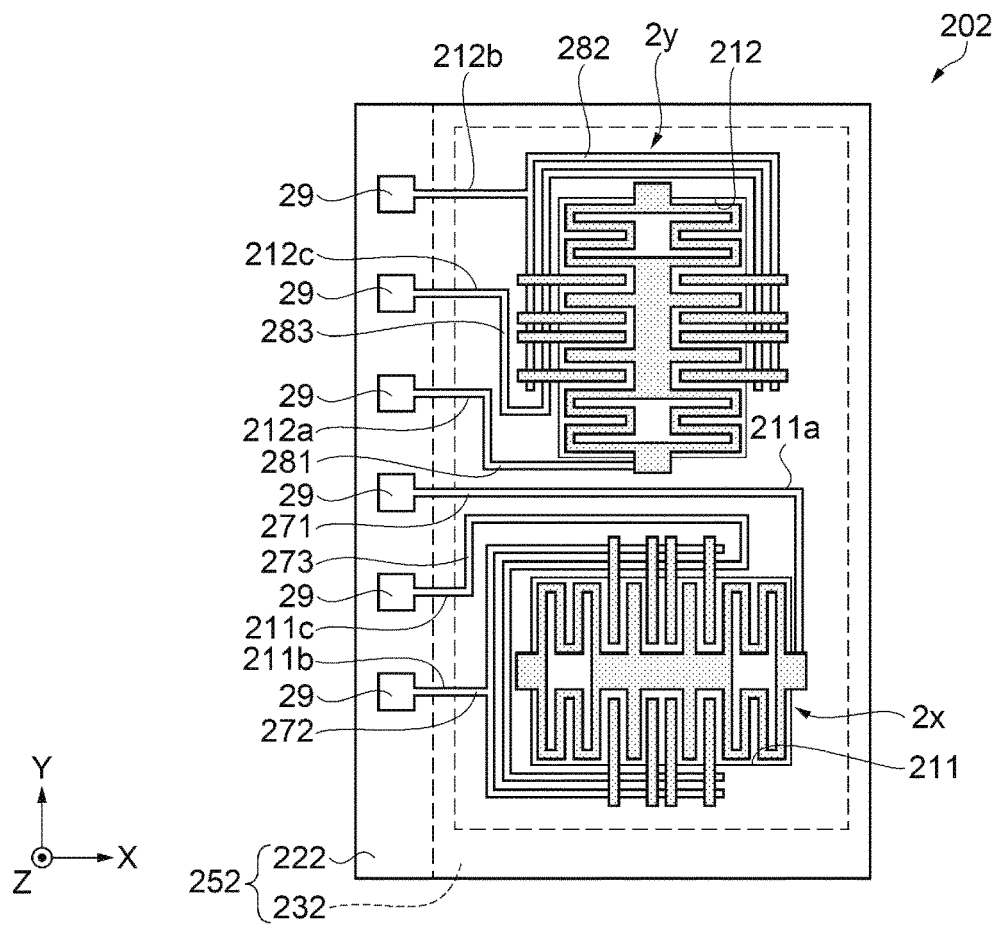
FIG. 11 is a plan view illustrating Application 2 of a sensor element.

Next, Application 2 of an acceleration sensor element will be described with reference to FIG. 11. FIG. 11 is a plan view illustrating Application 2 of a sensor element.

As illustrated in FIG. 11, an acceleration sensor element 202 according to Application 2 has two sensor units 2x and 2y. The sensor unit 2x is a portion that measures acceleration in an axis direction (X axis direction in the present example). Such a sensor unit 2x has the same configuration with the X axis sensor unit 21x described in FIGS. 4 and 6A. The sensor unit 2y is a portion that measures acceleration in an axis direction (Y axis direction in the present example). Such a sensor unit 2y has the same configuration with the Y axis sensor unit 21y described in FIGS. 4 and 6B. Therefore, a detailed description will be omitted. The sensor unit 2x and the sensor unit 2y are airtightly stored in the container 252 having the base substrate 222 and the cap 232 and having the same configuration with the first embodiment. In such an acceleration sensor element 202, acceleration in two axis directions (X axis direction and Y axis direction in the present example) can be measured.

In Application 2, an example capable of measuring acceleration in two axis directions, the X axis direction and the Y axis direction, is described. The invention is not limited to this, and a configuration in which a sensor unit similar to the Z axis sensor unit 21z described in FIGS. 4 and 6C is combined may be adopted. For example, a configuration capable of measuring acceleration in the X axis direction and the Z axis direction or the Y axis direction and the Z axis direction may be adopted.

A physical quantity sensor storing the acceleration sensor element 201 capable of measuring one axis or the acceleration sensor element 202 capable of measuring two axes as illustrated in Application 1 and Application 2 can be obtained.

Second Embodiment

Figure 12:
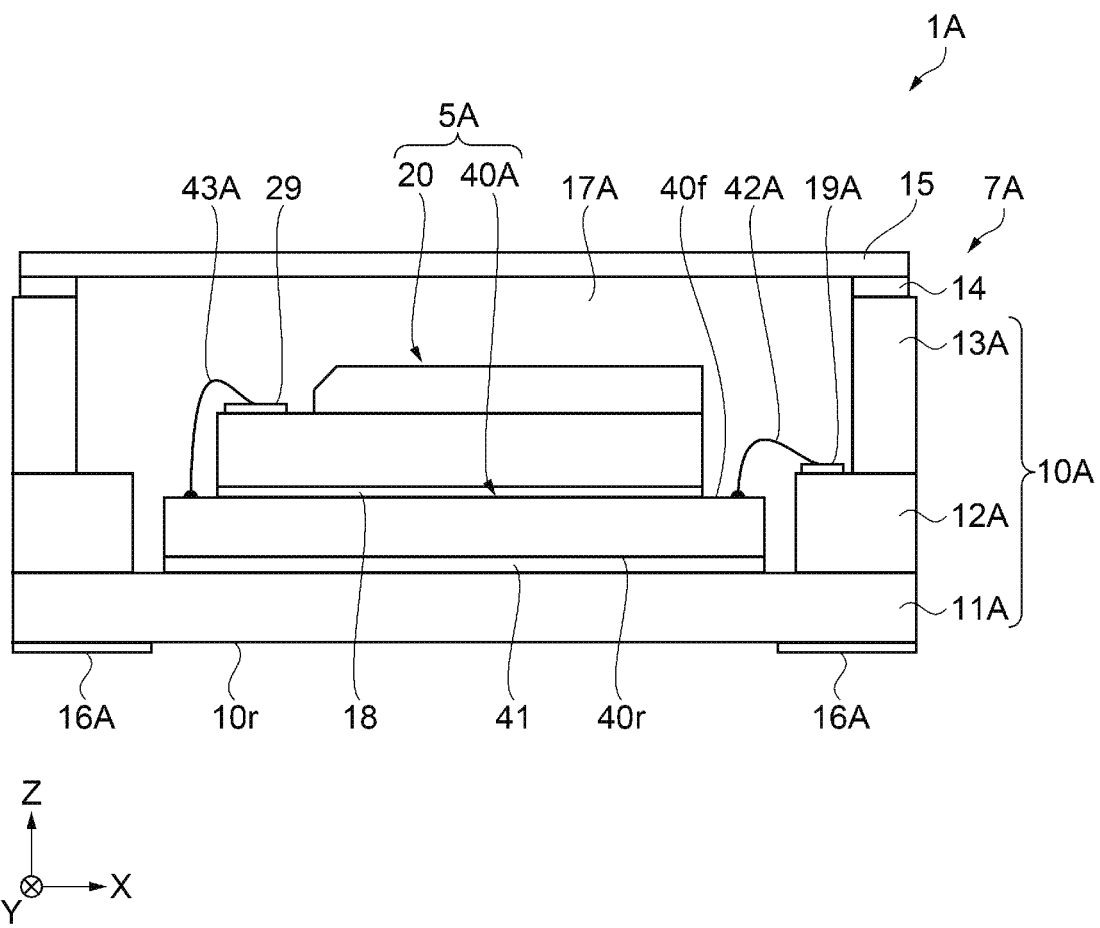
FIG. 12 is a sectional view illustrating a schematic configuration of a physical quantity sensor according to a second embodiment.

Next, a physical quantity sensor according to the second embodiment will be described with reference to FIG. 12. FIG. 12 is a sectional view illustrating a schematic configuration of a physical quantity sensor according to the second embodiment. Hereinafter, the three axes orthogonal to each other are described using the X axis, the Y axis, and the Z axis similar to the first embodiment. Furthermore, for the sake of convenience of explanation, the explanation may be made that a surface on the side in the +Z axis direction which is a side of the lid may be referred to as an upper surface, and a surface on a side in the −Z axis direction which is opposite to the +Z axis direction may be referred to as a lower surface, in a plan view seen from the Z axis direction. Hereinafter, the description will be focused on the differences with the above-described first embodiment, and the description of similar matters will be omitted.

As illustrated in FIG. 12, a physical quantity sensor 1A according to the second embodiment, similar to the first embodiment, can be used as a 3-axis acceleration sensor that can independently measure acceleration in the X axis direction, the Y axis direction, and the Z axis direction, respectively. Such a physical quantity sensor 1 includes a package 7A and a structure body 5A stored in the package 7A. The structure body 5A includes an integrated circuit (IC) 40A as a circuit element and the acceleration sensor element 20 as a sensor element disposed on the IC 40A, and a lower surface 40r of the IC 40A is connected to inside (storage space 17A) of the package 7A via the adhesive layer 41.

Package 7A

The package 7A includes a base portion 10A configured with a first base material 11A, a second base material 12A, and a third base material 13A, and the lid 15 connected to the third base material 13A via the sealing member 14. The configuration of the package 7A is the same as that of the first embodiment, so a detailed description thereof will be omitted.

In the package 7A, a recess portion (cavity) in which the structure body 5A is stored is formed by the second base material 12A and the third base material 13A that are annular substrates from which a central portion is removed. The package 7A is provided with a storage space (internal space) 17A that is an enclosed space in which an opening of the recess portion (cavity) is covered with the lid 15, and the structure body 5A can be stored in the storage space 17A. It is possible to obtain the compact physical quantity sensor 1A with high performance by storing the structure body 5A in such a storage space 17A. A part of an electrode pad (terminal electrode) and a wiring pattern formed in the base portion 10A including the first base material 11A and the second base material 12A are not illustrated.

The constituent materials of the first base material 11A, the second base material 12A, the third base material 13A, and the lid 15 are the same as those of the first embodiment, and therefore, description thereof is omitted.

A plurality of internal terminals 19A are disposed on an upper surface of the second base material 12A, and a plurality of external terminals 16 are disposed on an outer bottom surface 10r of the package 7A which is a lower surface of the first base material 11A. Each internal terminal 19A is electrically connected to the corresponding external terminal 16 via an internal wiring (not illustrated) and the like formed in the base portion 10A.

Structure Body 5A

The structure body 5A includes the IC 40A as a circuit element and the acceleration sensor element 20 as a sensor element disposed on the IC 40A. In the IC 40A, the lower surface 40r side is connected to the package 7A via the adhesive layer 41. The acceleration sensor element 20 is attached to the upper surface 40f of the IC 40A via the resin adhesive 18 as a bonding material. That is, the IC 40A corresponds to the substrate to which the acceleration sensor element 20 is attached in the second embodiment.

The resin adhesive 18 that attaches the acceleration sensor element 20 to the IC 40A is made such that the physical properties after curing are the same as those in the first embodiment. It is preferable that the thickness and the area in plan view from the Z axis direction of the resin adhesive 18 are the same as those in the first embodiment. Such a resin adhesive 18 is the same as those of the first embodiment, and therefore, description thereof is omitted. The functional configuration of the physical quantity sensor 1A and the configuration of the acceleration sensor element 20 are the same as those of the first embodiment, and therefore, description thereof is omitted.

The acceleration sensor element 20 and the IC 40A constituting the structure body 5A are electrically connected by the bonding wire 43A. The IC 40A is electrically connected to the internal terminal 19A provided in the package 7A (upper surface of second base material 12A) by the bonding wire 42A. The internal terminal 19A, and the external terminal 16A may be formed by a method in which a metal wiring material such as tungsten (W) and molybdenum (Mo) is screen-printed at a predetermined position and baked, and plating nickel (Ni), gold (Au) or the like is applied thereon.

The IC 40A includes, for example, a drive circuit that drives the acceleration sensor element 20, a measurement circuit (signal processing unit 45) that measures acceleration in each axis direction of the X axis, the Y axis and the Z axis based on the signal from the acceleration sensor element 20, and an output circuit (output unit 46) that converts a signal from the measurement circuit into a predetermined signal and outputs the signal. The IC 40A also includes a plurality of electrode pads (not illustrated) on an upper surface. Each electrode pad is electrically connected to the internal terminal 19A of the second base material 12A via the bonding wire 42A and each electrode pad is electrically connected to the connection terminal 29 of the acceleration sensor element 20 via the bonding wire 43A. Accordingly, it is possible to control the acceleration sensor element 20.

According to the physical quantity sensor 1A according to the second embodiment, by optimizing the elastic modulus e of the resin adhesive 18 that is a bonding material that attaches the acceleration sensor element 20 to the IC 40A as a substrate in the same manner as the first embodiment, it is possible to reduce the temperature hysteresis of the output signal of the acceleration data resulting from heating processing such as attaching the physical quantity sensor 1A on a circuit substrate (not illustrated) or a package (not illustrated).

Similar to the first embodiment, it is preferable that the glass transition temperature (Tg) of the resin adhesive 18 is outside the operation temperature range of the acceleration sensor element 20. In this way, since there is no singular point related to the physical properties of the resin adhesive 18 within the operation temperature range, the physical properties of the resin adhesive 18 hardly change, it is possible to further stabilize the temperature characteristics (temperature hysteresis) of the acceleration sensor element 20.

Furthermore, similar to the first embodiment, it is preferable that the thickness t of the resin adhesive 18 (see FIG.

2B) is less than 50 μm. Accordingly, generation of stress due to characteristic changes is small with the thin resin adhesive 18 even if the physical properties of the resin adhesive 18 change by heating processing and the like, and it is possible to reduce the influence on the characteristic of the acceleration sensor element 20.

Third Embodiment

Figure 13A:
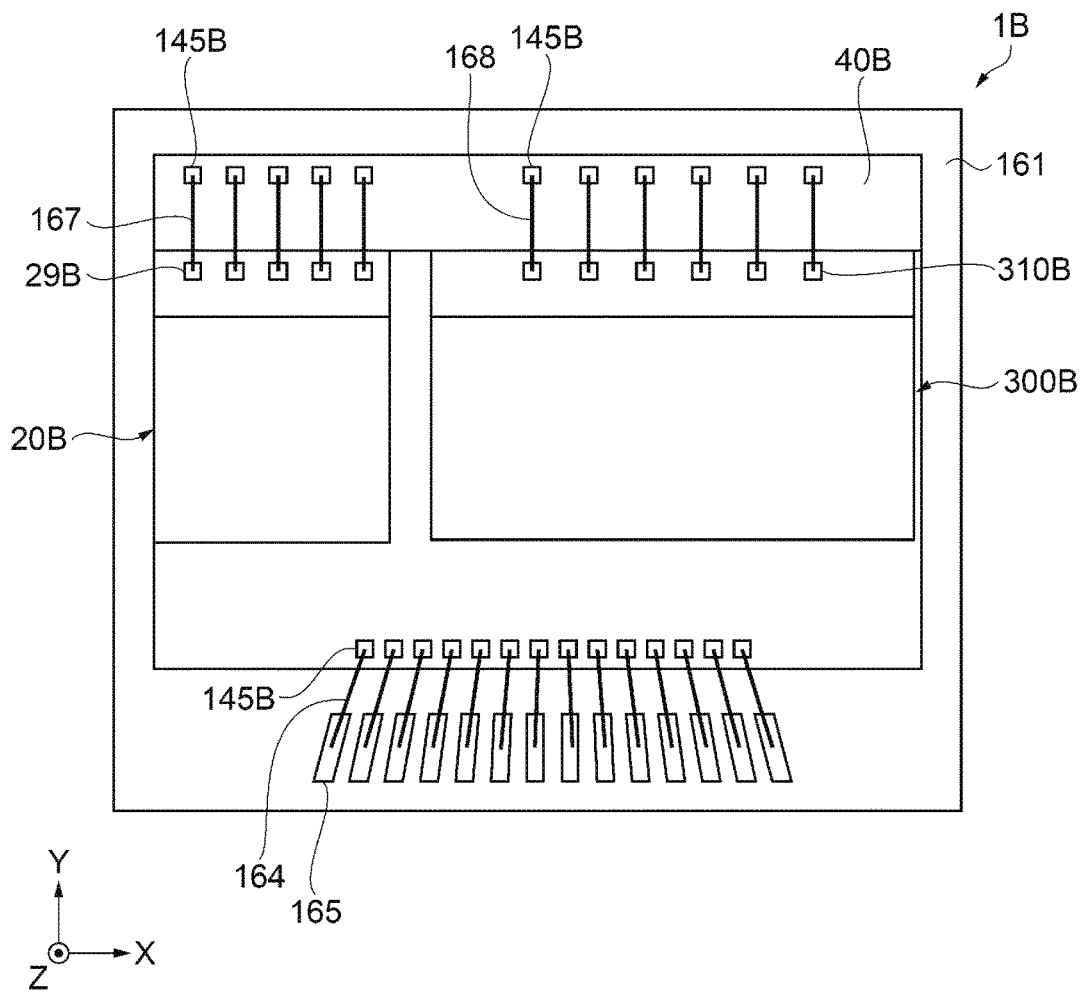
FIG. 13A is a plan view illustrating a schematic configuration of a physical quantity sensor according to a third embodiment.
Figure 13B:
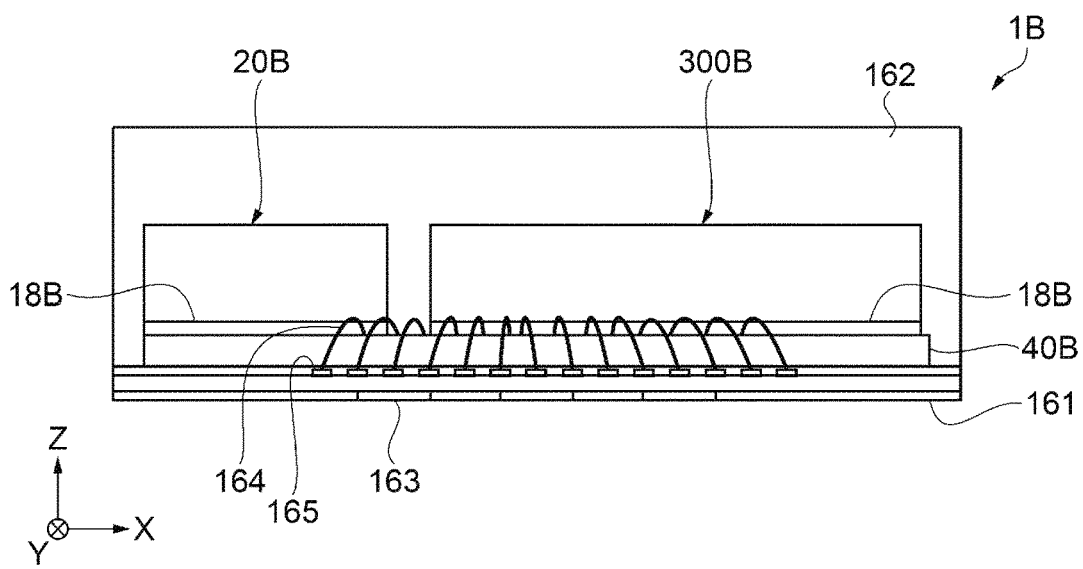
FIG. 13B is a sectional view illustrating a schematic configuration of the physical quantity sensor according to the third embodiment.

Next, a physical quantity sensor according to the third embodiment will be described with reference to FIGS. 13A and 13B. FIG. 13A is a plan view illustrating a schematic configuration of a physical quantity sensor according to the third embodiment. Furthermore, for the sake of convenience of explanation, FIG. 13A illustrates a state in which the resin package is seen through. FIG. 13B is a sectional view illustrating a schematic configuration of the physical quantity sensor according to the third embodiment. Hereinafter, the three axes orthogonal to each other are described using the X axis, the Y axis, and the Z axis similar to the first embodiment. Furthermore, for the sake of convenience of explanation, a surface on the side in the +Z axis direction which is a side of the sensor element may be referred to as an upper surface, and a surface on a side in the −Z axis direction which is opposite to the +Z axis direction may be referred to as a lower surface, in a plan view seen from the Z axis direction. Hereinafter, the description will be focused on the differences with the above-described first embodiment, and the description of similar matters will be omitted.

As illustrated in FIGS. 13A and 13B, a physical quantity sensor 1B according to the third embodiment can be used as a complex sensor (6-axis sensor) that added a 3-axis acceleration sensor that can independently measure acceleration in each of the X axis direction, the Y axis direction, and the Z axis direction and a 3-axis angular velocity sensor that can independently measure angular velocity in each of the X axis direction, the Y axis direction, and the Z axis direction. Such a physical quantity sensor 1B includes a base substrate 161, an integrated circuit (IC) 40B as a circuit element disposed on the base substrate 161, an acceleration sensor element 20B and an angular velocity sensor element 300B as a sensor element that are attached on the upper surface of the IC 40B via the resin adhesive 18B as a bonding material, and a resin package 162 that covers these elements. In the present embodiment, the IC 40B corresponds to the substrate to which the acceleration sensor element 20B and the angular velocity sensor element 300B are attached.

The IC 40B includes, for example, a drive circuit that drives the acceleration sensor element 20B and the angular velocity sensor element 300B, a measurement circuit that measures acceleration in each axis direction of the X axis, the Y axis and the Z axis based on the signal from the acceleration sensor element 20B, a measurement circuit that measures the angular velocity in each axis direction of the X axis, the Y axis and the Z axis based on the signal from the angular velocity sensor element 300B, and an output circuit that converts a signal from each measurement circuit into a predetermined signal and outputs the signal.

The IC 40B also includes a plurality of electrode pads 145B on an upper surface. Each electrode pad 145B is electrically connected to the connection terminal 165 of the base substrate 161 via the bonding wire 164. Each electrode pad 145B is electrically connected to the connection terminal 29B of the acceleration sensor element 20B via the bonding wire 167. Each electrode pad 145B is electrically connected to the terminal 310B of the angular velocity sensor element 300B via the bonding wire 168. Accordingly, the IC 40B can control the acceleration sensor element 20B and the angular velocity sensor element 300B.

The physical properties of the resin adhesive 18B that attaches the acceleration sensor element 20B and the angular velocity sensor element 300B to the IC 40B after curing is made such that the physical properties after curing are the same as those in the first embodiment. It is preferable that the thickness and the area in plan view from the Z axis direction of the resin adhesive 18B are the same as those in the first embodiment. Such a resin adhesive 18B is the same as those of the first embodiment, and therefore, description thereof is omitted. The configuration of the acceleration sensor element 20B is the same as those of the first embodiment, and therefore, description thereof is omitted. The acceleration sensor element 20B is not necessarily limited to the angular velocity sensor element 300B capable of measuring in three axis directions, and an acceleration sensor element capable of measuring two axes or one axis according to the requirement of the use (refer to acceleration sensor element 201 in FIG. 10 or acceleration sensor element 202 in FIG. 11) can be used.

The angular velocity sensor element 300B includes three sensor units (not illustrated) that measure each angular velocity in the X axis direction, the Y axis direction and the Z axis direction stored in the container by each axis. As three sensor units, for example, an oscillating gyro sensor which uses crystal as an oscillator and measures angular velocity from the Coriolis force applied to an oscillating object or a gyro sensor which uses ceramics or silicon as an oscillator may be used. The three sensor units that measure each angular velocity in the X axis direction, the Y axis direction and the Z axis direction by each axis can be any configuration that a single sensor unit is stored in the container (angular velocity sensor element 300 which will be described in the paragraphs bellow using FIGS. 15A and 15B), or a configuration that three sensor units are stored in a single container. The angular velocity sensor element 300B may not be necessarily limited to three axes, and can be an angular velocity sensor element capable of measuring one axis or two axes according to the requirement of the use.

A plurality of external terminals 163 are provided on a lower surface of the base substrate 161. The plurality of external terminals 163 are electrically connected to connection terminals 165 that corresponds to each of external terminal 163 and are provided on an upper surface of the base substrate 161 via internal wirings (not illustrated).

According to the physical quantity sensor 1B according to the third embodiment, by optimizing the elastic modulus e of the resin adhesive 18B (bonding material) that attaches the acceleration sensor element 20B onto an upper surface of the IC 40B as a substrate, it is possible to reduce the temperature hysteresis of the output signal of the acceleration data resulting from heating processing such as attaching the physical quantity sensor 1B on a circuit substrate (not illustrated) or a package (not illustrated). Since the angular velocity sensor element 300B is also attached to the upper surface of the IC 40B by the resin adhesive 18B, the same effect can be obtained as described above by optimizing the elastic modulus e of the resin adhesive 18B. It is possible to easily construct a complex inertial sensor including the acceleration sensor element 20B and the angular velocity sensor element 300B, and angular velocity data can be obtained in addition to acceleration data.

Fourth Embodiment

Figure 14A:
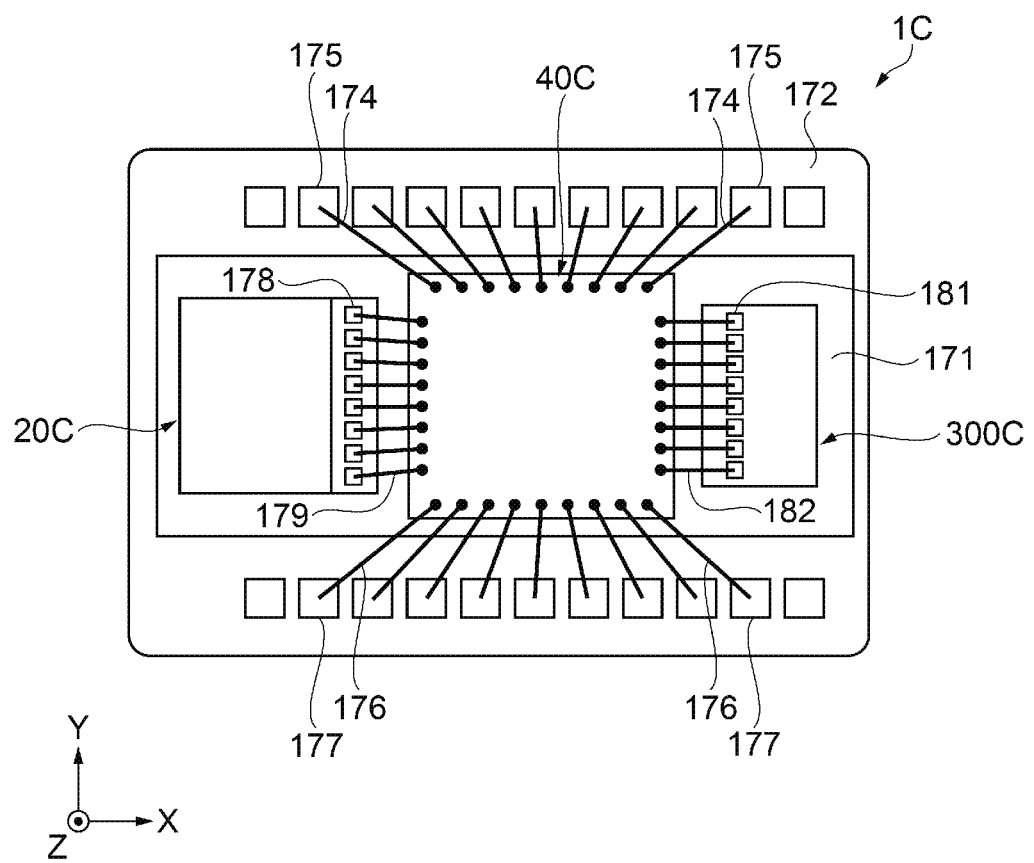
FIG. 14A is a plan view illustrating a schematic configuration of a physical quantity sensor according to a fourth embodiment.
Figure 14B:
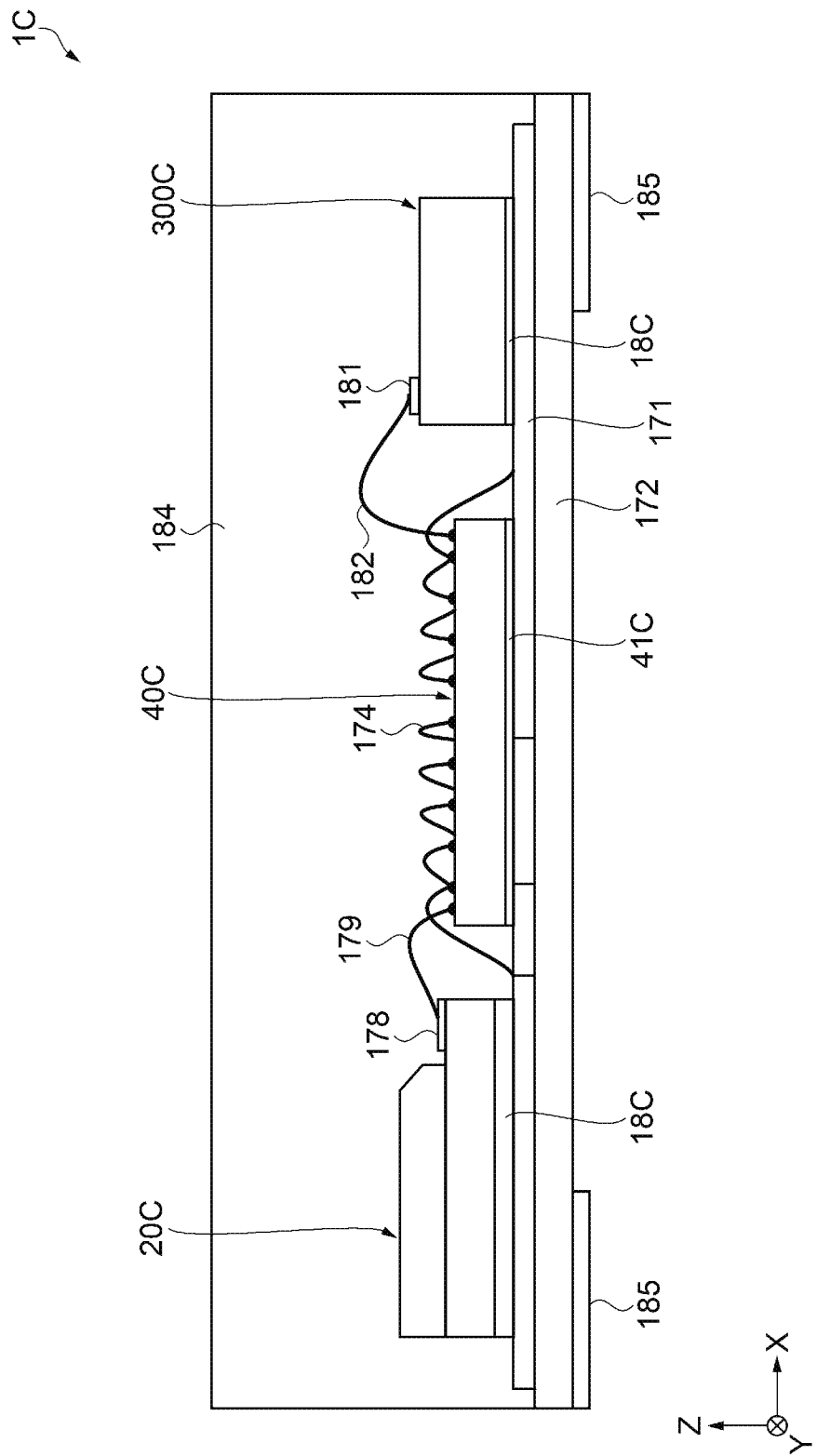
FIG. 14B is a sectional view illustrating a schematic configuration of the physical quantity sensor according to the fourth embodiment.

Next, a physical quantity sensor according to the fourth embodiment will be described with reference to FIGS. 14A and 14B. FIG. 14A is a plan view illustrating a schematic configuration of a physical quantity sensor according to the fourth embodiment. Furthermore, for the sake of convenience of explanation, FIG. 14A illustrates a state in which the resin package is seen through. FIG. 14B is a sectional view illustrating a schematic configuration of the physical quantity sensor according to the fourth embodiment. Hereinafter, the three axes orthogonal to each other are described using the X axis, the Y axis, and the Z axis similar to the first embodiment. Furthermore, for the sake of convenience of explanation, a surface on the side in the +Z axis direction which is a side of the sensor element may be referred to as an upper surface, and a surface on a side in the −Z axis direction which is opposite to the +Z axis direction may be referred to as a lower surface, in a plan view seen from the Z axis direction. Hereinafter, the description will be focused on the differences with the above-described first embodiment, and the description of similar matters will be omitted.

As illustrated in FIGS. 14A and 14B, a physical quantity sensor 1C according to the fourth embodiment can be used as a 6-axis sensor that added a 3-axis acceleration sensor that can independently measure acceleration in each of the X axis direction, the Y axis direction, and the Z axis direction and a 3-axis angular velocity sensor that can independently measure angular velocity in each of the X axis direction, the Y axis direction, and the Z axis direction in the same manner as the third embodiment.

Such a physical quantity sensor 1C includes a frame 171, an integrated circuit (IC) 40C as a circuit element disposed on the frame 171, the acceleration sensor element 20C and an angular velocity sensor element 300C as a sensor element disposed on both sides one by one in the X direction of the IC 40C in the plan view from the Z axis direction, and a resin package 184 that covers those configuration sites. The frame 171 is attached to a circuit substrate 172 via bonding member (not illustrated). The acceleration sensor element 20C and the angular velocity sensor element 300C are attached on an upper surface of the frame 171 via a resin adhesive 18C as a bonding material. The IC 40C is attached on an upper surface of the frame 171 via an adhesive layer 41C as an adhesive. In the present embodiment, the frame 171 corresponds to the substrate to which the acceleration sensor element 20C and the angular velocity sensor element 300C are attached.

The IC 40C includes, for example, a drive circuit that drives the acceleration sensor element 20C and the angular velocity sensor element 300C, a measurement circuit that measures acceleration in each axis direction of the X axis, the Y axis and the Z axis based on the signal from the acceleration sensor element 20C, a measurement circuit that measures the angular velocity in each axis direction of the X axis, the Y axis and the Z axis based on the signal from the angular velocity sensor element 300C, and an output circuit that converts a signal from each measurement circuit into a predetermined signal and outputs the signal.

The IC 40C also includes a plurality of electrode pads (not illustrated) on an upper surface. Each electrode pad is electrically connected to the connection terminals 175 and 177 of the circuit substrate 172 via the bonding wires 174 and 176. Each electrode pad is electrically connected to the terminal 178 of the acceleration sensor element 20C via the bonding wire 179. Each electrode pad is electrically connected to the terminal 181 of the angular velocity sensor element 300C via the bonding wire 182. Accordingly, the IC 40C can control the acceleration sensor element 20C and the angular velocity sensor element 300C.

The resin adhesive 18C that attaches the acceleration sensor element 20C and the angular velocity sensor element 300C to the frame 171 is made such that the physical properties after curing are the same as those in the first embodiment. It is preferable that the thickness and the area in plan view from the Z axis direction of the resin adhesive 18C are the same as those in the first embodiment. Such a resin adhesive 18C is the same as those of the first embodiment, and therefore, description thereof is omitted. The configuration of the acceleration sensor element 20C is the same as those of the first embodiment, and therefore, description thereof is omitted. The acceleration sensor element 20C is not necessarily limited to the angular velocity sensor element 300C capable of measuring in three axis directions, and an acceleration sensor element capable of measuring two axes or one axis according to the requirement of the use (refer to acceleration sensor element 201 in FIG. 10 or acceleration sensor element 202 in FIG. 11) can be used.

The angular velocity sensor element 300C includes three sensor units (not illustrated) that measure each angular velocity in the X axis direction, the Y axis direction and the Z axis direction stored in the container by each axis. As three sensor units, for example, an oscillating gyro sensor which uses crystal as an oscillator and measures angular velocity from the Coriolis force applied to an oscillating object or a gyro sensor which uses ceramics or silicon as an oscillator may be used. The three sensor units that measure each angular velocity in the X axis direction, the Y axis direction and the Z axis direction by each axis can be any configuration that a single sensor unit is stored in the container (will be described in the paragraphs bellow using FIGS. 15A and 15B), or a configuration that three sensor units are stored in a single container. The angular velocity sensor element 300C may not be necessarily limited to three axes, and can be an angular velocity sensor element capable of measuring one axis or two axes according to the requirement of the use.

A plurality of external terminals 185 are provided on a lower surface of the circuit substrate 172. The plurality of external terminals 185 correspond to each connection terminals 175 and 177 provided on an upper surface of the circuit substrate 172 and are electrically connected to via internal wirings (not illustrated).

According to the physical quantity sensor 1C according to the fourth embodiment, by optimizing the elastic modulus e of the resin adhesive 18C (bonding material) that attaches the acceleration sensor element 20C to the frame 171 as a substrate, it is possible to reduce the temperature hysteresis of the output signal of the acceleration data resulting from heating processing such as attaching the physical quantity sensor 10 on a circuit substrate (not illustrated) or a package (not illustrated). Since the angular velocity sensor element 300C is also attached to the frame 171 by the resin adhesive 18C, the same effect can be obtained as described above by optimizing the elastic modulus e of the resin adhesive 18C. It is possible to easily construct a complex inertial sensor including the acceleration sensor element 20C and the angular velocity sensor element 300C, and angular velocity data can be obtained in addition to acceleration data.

Angular Velocity Sensor Element

Figure 15A:
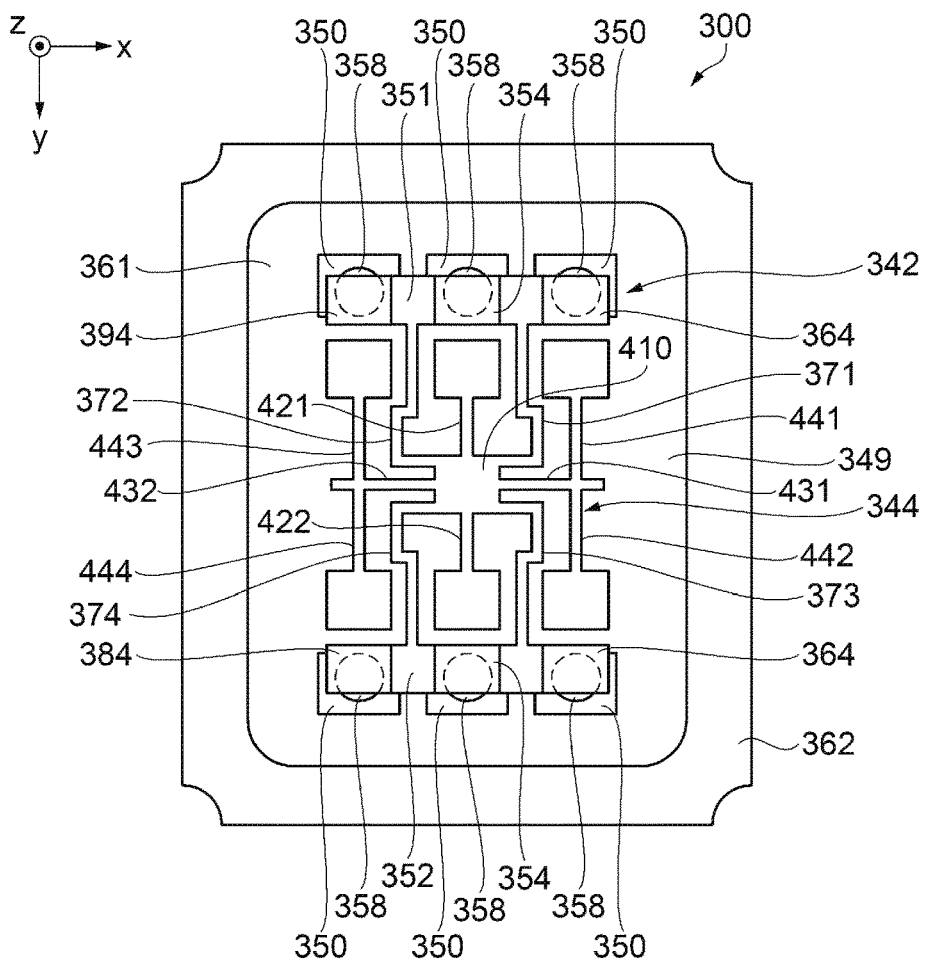
FIG. 15A is a plan view illustrating an example of an angular velocity sensor element used in a physical quantity sensor.
Figure 15B:
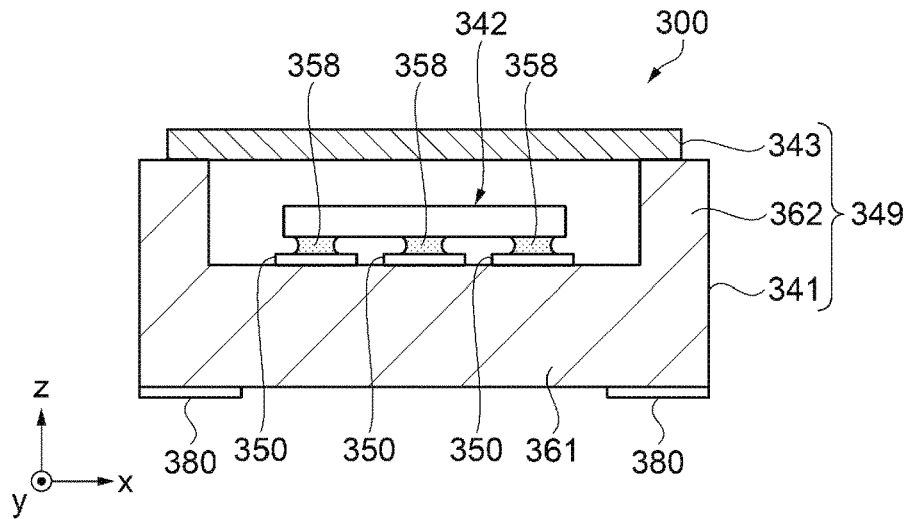
FIG. 15B is a sectional view of FIG. 15A illustrating an example of an angular velocity sensor element.

Here, an example of an angular velocity sensor element will be described with reference to FIGS. 15A and 15B. FIG. 15A is a plan view illustrating an example of an angular velocity sensor element used in a physical quantity sensor. Furthermore, for the sake of convenience of explanation, the lid is omitted in FIG. 15A. FIG. 15B is a sectional view of FIG. 15A illustrating an example of an angular velocity sensor element. In FIGS. 15A and 15B, the three axes orthogonal to each other are described as an x axis, a y axis, and a z axis, and the z axis, corresponds to the thickness direction of the oscillation device. A direction parallel to the x axis refers to an "x axis direction (second direction)", a direction parallel to the y axis refers to a "y axis direction (first direction)", and a direction parallel to the z axis refers to a "z axis direction".

The angular velocity sensor element 300 illustrated in FIGS. 15A and 15B includes a gyro element 342 and a package 349 that stores the gyro element 342. Hereinafter, the gyro element 342 and the package 349 will be described in details.

FIG. 15A illustrates the gyro element 342 seen from an upper side (lid 343 side). A measurement signal electrode, a measurement signal wiring, a measurement signal terminal, a measurement ground electrode, a measurement ground wiring, a measurement ground terminal, a drive signal electrode, a drive signal wiring, a drive signal terminal, a drive ground electrode, a drive ground wiring, a drive ground terminal, and the like are provided in the gyro element 342, but omitted in FIG. 15A.

The gyro element 342 is an "out-of-plane measurement type" sensor that measures angular velocity around the z axis. Although not illustrated, the gyro element 342 is configured with a base material, a plurality of electrodes, wirings, and terminals provided on a surface of the base material. The gyro element 342 can be made of a piezoelectric material such as crystal, lithium tantalate, lithium niobate or the like, and among these, it is preferable to be constituted of crystal. Thereby, the gyro element 342 capable of exhibiting excellent oscillation characteristics (frequency characteristics) can be achieved.

Such a gyro element 342 includes a so-called double T type oscillation body 344, a first support portion 351 and a second support portion 352 as a support portion that supports the oscillation body 344, a first coupling beam 371 and a second coupling beam 372 that couple the oscillation body 344 and the first support portion 351, and a third coupling beam 373 and a fourth coupling beam 374 that couple the oscillation body 344 and the second support portion 352.

The oscillation body 344 has a spread in the xy plane, and has a thickness in the z axis direction. Such an oscillation body 344 includes abase 410 positioned in a center, a first measurement oscillation arm 421 and a second measurement oscillation arm 422 extending to both sides along the y axis direction from the base 410, a first coupling arm 431 and a second coupling arm 432 extending to both sides along the x axis direction from the base 410, a first drive oscillation arm 441 and a third drive oscillation arm 442 extending to both sides along the y axis direction from a tip end portion of the first coupling arm 431, and a second drive oscillation arm 443 and a fourth drive oscillation arm 444 extending to both sides along the y axis direction from a tip end portion of the second coupling arm 432.

The first drive oscillation arm 441 and the third drive oscillation arm 442 may extend from middle of an extending direction of the first coupling arm 431, and similarly, the second drive oscillation arm 443 and the fourth drive oscillation arm 444 may also extend from middle of an extending direction of the second coupling arm 432. In the present embodiment, a configuration that the first drive oscillation arm 441 and the third drive oscillation arm 442 and the second drive oscillation arm 443 and the fourth drive oscillation arm 444 are extending from the first coupling arm 431 and the second coupling arm 432 extending from the base 410 is described. However, a base may include the base 410, the first coupling arm 431, and the second coupling arm 432. That is, a configuration that a first drive oscillation arm, a second drive oscillation arm, a third drive oscillation arm, and a fourth drive oscillation arm extending from a base may be adopted.

The gyro element 342 with the above-described configuration measures angular velocity ω around the z axis as follows. In a state that the angular velocity ω is not applied, when an electric field is generated between a drive signal electrode (not illustrated) and a drive ground electrode (not illustrated), each drive oscillation arm 441, 443, 442, and 444 of the gyro element 342 performs bending oscillation in the x axis direction. In this state of performing the drive oscillation, when angular velocity is applied to the gyro element 342 around the z axis, oscillation in the y axis direction is generated. That is, when Coriolis force is applied to the drive oscillation arms 441, 443, 442, and 444 and the coupling arms 431 and 432 in the y axis direction, measurement oscillation of the measurement oscillation arms 421 and 422 is excited in the x axis direction in response to the oscillation. The angular velocity can be achieved by the measurement signal electrode (not illustrated) and the measurement ground electrode (not illustrated) measuring the distortion of the measurement oscillation arms 421 and 422 generated by this oscillation.

The gyro element 342 storing the package 349 will be described. The package 349 is to store the gyro element 342. In the package 349, an IC chip that performs drive of the gyro element 342 and the like may be stored in addition to the gyro element 342. Such a package 349 has a substantially rectangular shape in the plan view (in xy plan view).

The package 349 includes a base 341 having a recess portion opening on upper surface and a lid 343 that is bonded with the base so as to cover the opening of the recess portion. The base 341 also includes a plate-shaped bottom plate 361 and a frame-shaped side wall 362 provided at an upper peripheral edge of the bottom plate 361. Such a package 349 has a storage space therein, and the gyro element 342 is airtightly stored and disposed in the storage space.

The gyro element 342 is fixed on an upper surface of the bottom plate 361 via a conductive fixed member 358 such as solder and a conductive adhesive (adhesive in which a conductive filler such as silver metal particles is dispersed in a resin material) in the first support portion 351 and the second support portion 352. Since the first support portion 351 and the second support portion 352 are positioned on both end portions of the gyro element 342 in the y axis direction, by fixing such a portion to the bottom plate 361, the oscillation body 344 of the gyro element 342 is supported at both ends and the gyro element 342 can be stably fixed to the bottom plate 361.

Six conductive fixed members 358 are provided (in contact) with two measurement signal terminals 364, two measurement ground terminals 354, a drive signal terminal 384, and a drive ground terminal 394 provided in the first support portion 351 and the second support portion 352 and are apart from each other. Six connection pads 350 corresponding to the two measurement signal terminals 364, the two measurement ground terminals 354, the drive signal terminal 384, and the drive ground terminal 394 are provided on an upper surface of the bottom plate 361, and each of these connection pads 350 is electrically connected to any one of the corresponding terminals via the conductive fixed member 358. The connection pad 350 is electrically connected to the external terminal 380 via an internal wiring, a through electrode, and the like (not illustrated).

According to the gyro element 342 with such a configuration, the required angular velocity in one axis direction can be measured efficiently with high accuracy.

Complex Sensor

Figure 16:
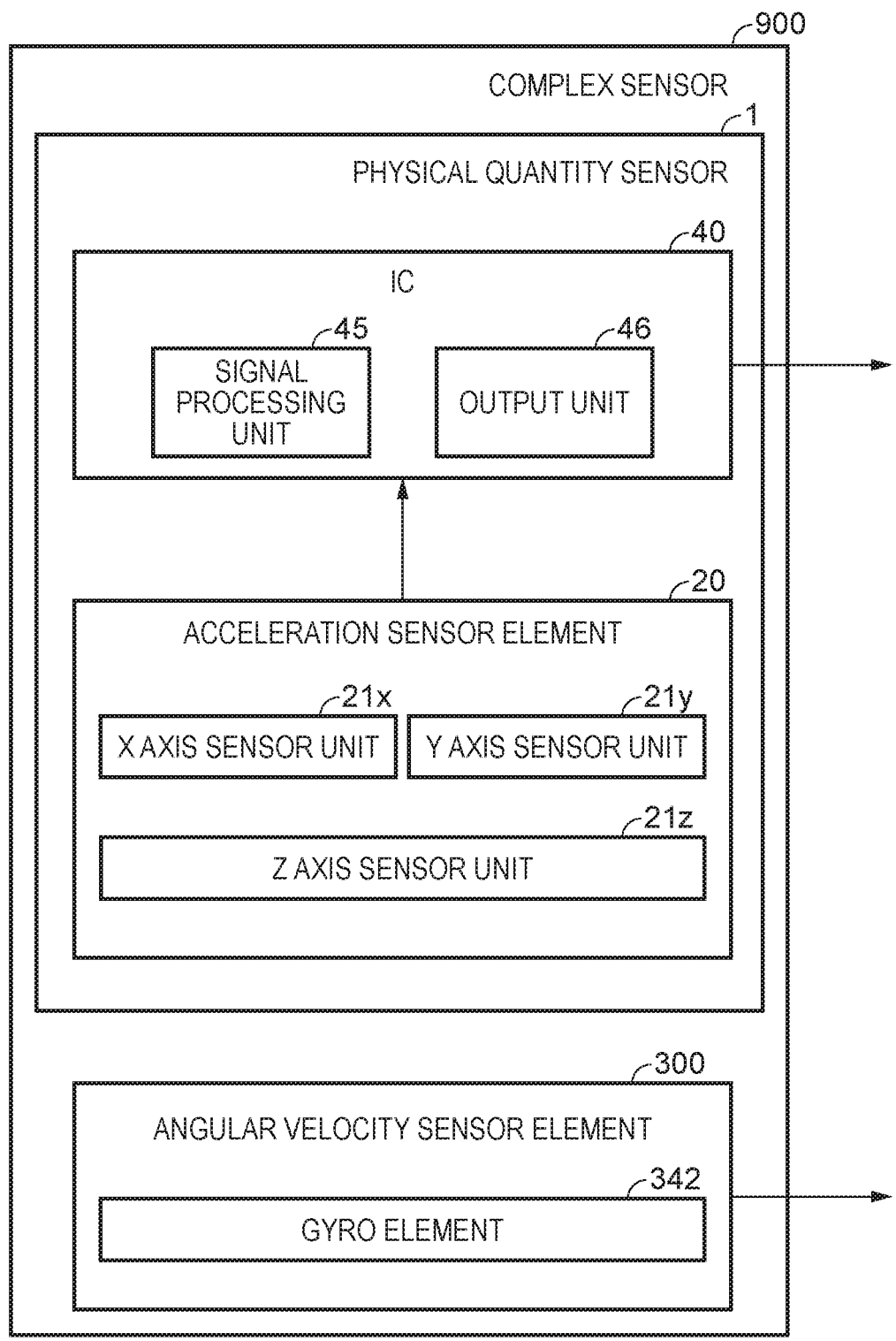
FIG. 16 is a functional block diagram illustrating a schematic configuration of a complex sensor.

Next, a configuration example of a complex sensor including the above-described physical quantity sensor 1 will be described with reference to FIG. 16. FIG. 16 is a functional block diagram illustrating a schematic configuration of a complex sensor. Hereinafter, an example using the physical quantity sensor 1 will be described.

As illustrated in FIG. 16, a complex sensor 900 is provided with the physical quantity sensor 1 that includes the above-described acceleration sensor element 20 and the angular velocity sensor element 300 including the gyro element 342. The physical quantity sensor 1 can measure the acceleration of three axes as described above. The angular velocity sensor element 300 can efficiently and highly accurately measure the required angular velocity in the one axis direction. The angular velocity sensor element 300 is provided with three angular velocity sensor elements 300 to measure each angular velocity in three axis directions. The complex sensor 900 can include the IC 40 that includes, for example, a drive circuit that drives the acceleration sensor element 20, a measurement circuit (signal processing unit 45) that measures acceleration in each axis direction of the X axis, the Y axis and the Z axis based on the signal from the acceleration sensor element 20, and an output circuit (output unit 46) that converts the signal from each measurement circuit into a predetermined signal and outputs the converted signal.

According to such a complex sensor 900, the complex sensor 900 can be easily configured with the physical quantity sensor 1 and the angular velocity sensor element 300, for example, acceleration data and angular velocity data can be achieved.

Inertial Measurement Unit

Figure 17:
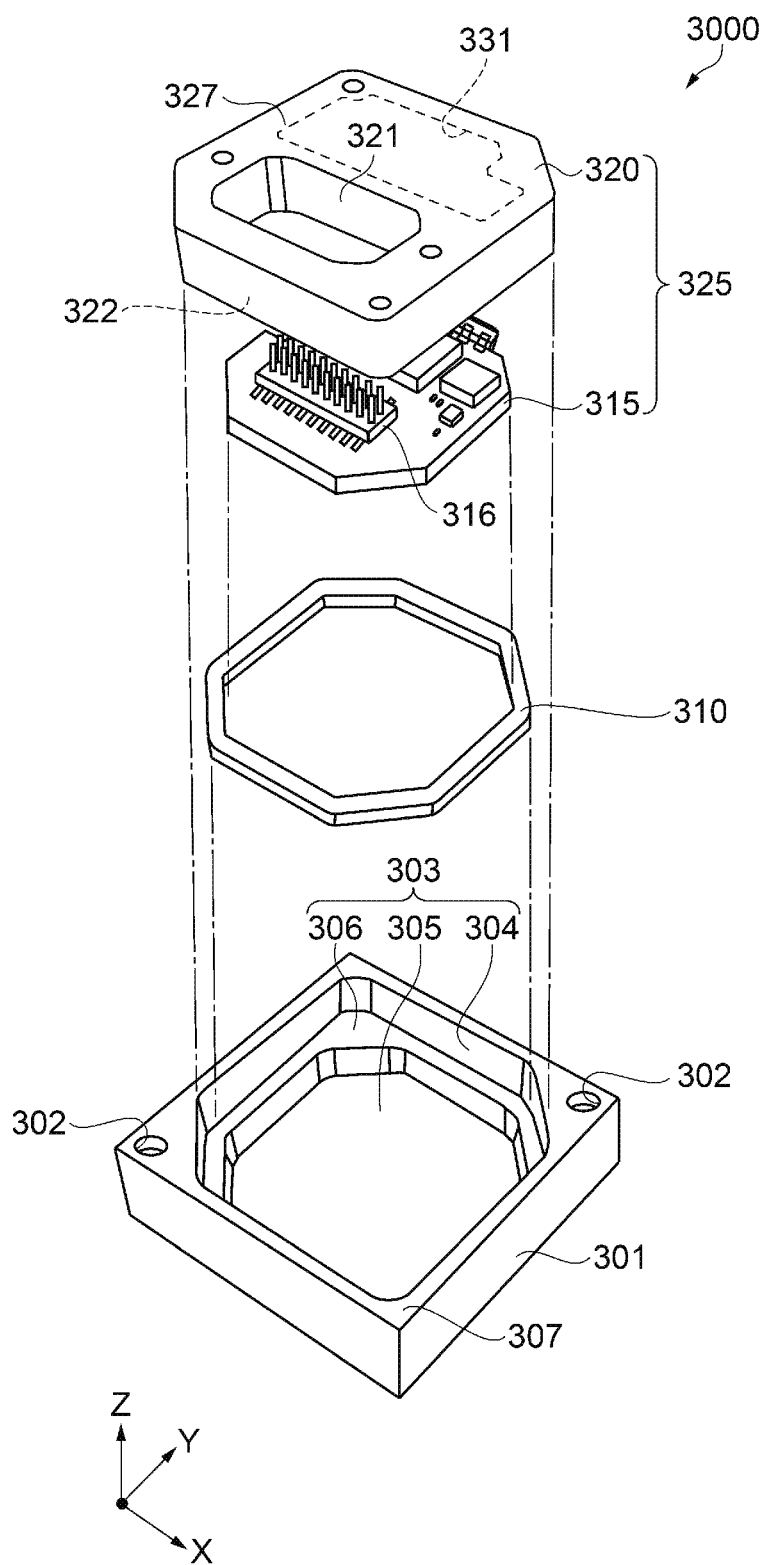
FIG. 17 is a disassembled perspective view illustrating a schematic configuration of an inertial measurement unit.
Figure 18:
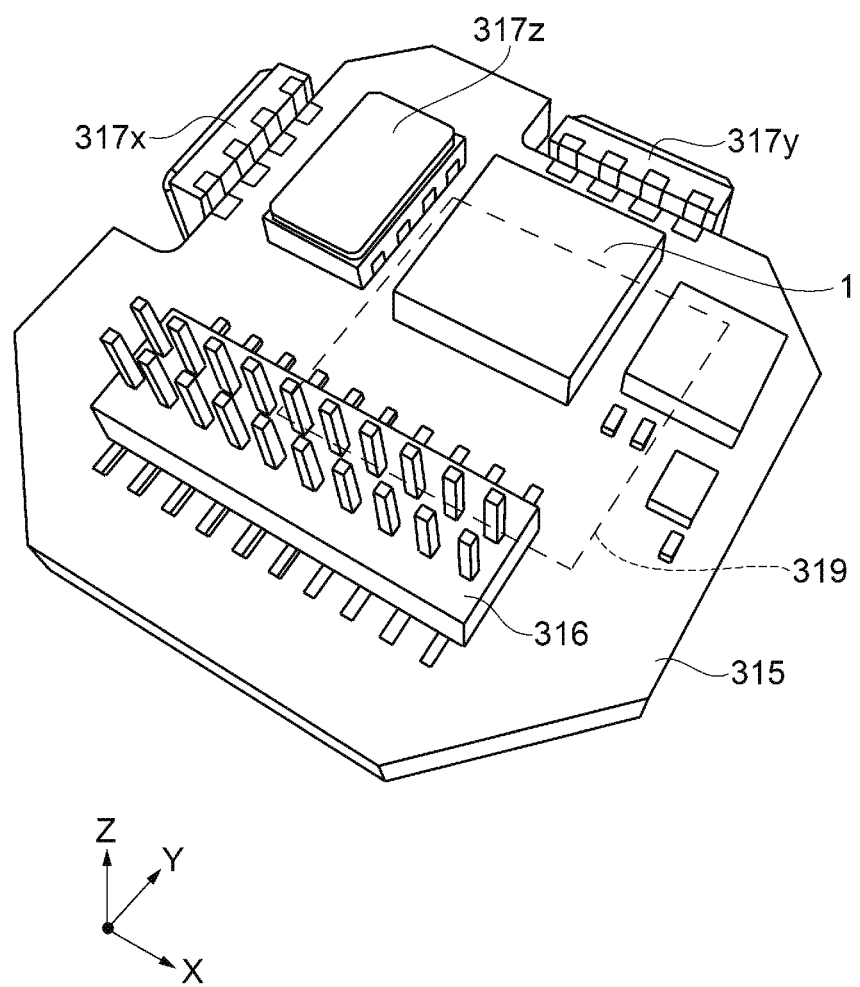
FIG. 18 is a perspective view illustrating a disposal example of an inertial sensor element of the inertial measurement unit.

Next, an inertial measurement unit (IMU) will be described with reference to FIGS. 17 and 18. FIG. 17 is a disassembled perspective view illustrating a schematic configuration of an inertial measurement unit. FIG. 18 is a perspective view illustrating a disposal example of inertial sensor elements of the inertial measurement unit. Hereinafter, an example using the physical quantity sensor 1 will be described.

As illustrated in FIG. 17, an inertial measurement unit 3000 is configured with a sensor module 325 including an outer case 301, a bonding member 310, and an inertial sensor element. In other words, the sensor module 325 is engaged (inserted) in an inner portion 303 of the outer case 301 with the bonding member 310 interposed therebetween. The sensor module 325 is configured with an inner case 320 and the substrate 315. To make the explanation easier to understand, although the site names are defined as the outer case and the inner case, it may be called the first case and the second case.

The outer case 301 is a pedestal from which aluminum is cut out into a box shape. The material is not limited to aluminum, and other metals such as zinc and stainless steel, resin, or a composite material of metal and resin may be used. The outer shape of the outer case 301 is a rectangular parallelepiped having a substantially square planar shape similar to the overall shape of the above-described inertial measurement unit 3000, and penetration holes (shortcut holes) 302 are formed in the vicinity of two apexes positioned in a diagonal direction of the square, respectively. The invention is not limited to the penetration holes (shortcut holes) 302. For example, a configuration in which a notch (structure in which a notch is formed at a corner portion of the outer case 301 where the penetration holes (shortcut holes) 302 is positioned) that can be screwed by screws is formed and screwed, or a configuration in which a flange (ears) is formed on the side surface of the outer case 301 and the flange portion is screwed may be adopted.

The outer case 301 has a rectangular parallelepiped and a box-like shape without a lid, and the inner portion 303 (inside) thereof is an internal space (container) surrounded by a bottom wall 305 and a side wall 304. In other words, the outer case 301 has a box shape having one surface facing the bottom wall 305 as an opening surface, the sensor module 325 is stored so as to cover most of the opening portion of the opening surface (so as to cover the opening portion), and the sensor module 325 is exposed from the opening portion (not illustrated). Here, the opening surface facing the bottom wall 305 is the same surface as the upper surface 307 of the outer case 301. The planar shape of the inner portion 303 of the outer case 301 is a hexagon obtained by chamfering corners of two apex portions of a square, and the two chamfered apex portions correspond to the positions of the penetration holes (shortcut holes) 302. In the cross-sectional shape (thickness direction) of the inner portion 303, the inner portion 303, that is, a first bonding surface 306 as a bottom wall one step higher than the central portion is formed on the peripheral edge portion of the internal space in the bottom wall 305. That is, the first bonding surface 306 is a part of the bottom wall 305, is a single step-like site portion formed in a ring shape surrounding the central portion of the bottom wall 305 in plan view, and is a surface with a smaller distance from the opening surface (same surface as upper surface 307) than the bottom wall 305.

An example in which the outer shape of the outer case 301 is a rectangular parallelepiped having a substantially square planar shape and a box shape without a lid is described. However, the invention is not limited to this. The planar shape of the outer shape of the outer case 301 may be, for example, a polygon such as a hexagon or an octagon, the corners of the apex portions of the polygon may be chamfered or may be a planar shape in which each side is a curved line. The planar shape of the inner portion 303 (inside) of the outer case 301 is not limited to the above-mentioned hexagon, and it may be a rectangle (tetragon) such as a square or another polygonal shape such as an octagon. The outer shape of the outer case 301 and the planar shape of the inner portion 303 may be similar or may not be similar figures.

The inner case 320 is a member that supports the substrate 315 and has a shape to fit in the inner portion 303 of the outer case 301. Specifically, in a plan view, the shape thereof is a hexagon that the corners of the two apex portions of the square are chamfered, and an opening portion 321 that is a rectangular through-hole and a recess portion 331 that is provided on the surface that supports the substrate 315 are formed therein. The two chamfered apex portions correspond to the positions of the penetration holes (shortcut holes) 302 of the outer case 301. The height in the thickness direction (Z axis direction) is lower than the height from an upper surface 307 of the outer case 301 to the first bonding surface 306. In the preferred example, the inner case 320 is also formed by scraping out aluminum, but other materials may be used like the outer case 301.

Guide pins and supporting surfaces (not illustrated) for positioning the substrate 315 are formed on a rear surface (surface on the side of outer case 301) of the inner case 320. The substrate 315 is set (positioned and installed) on the guide pin and the support surface and adheres to the rear surface of the inner case 320. Details of the substrate 315 will be described later. The peripheral edge portion of the rear surface of the inner case 320 is a second bonding surface 322 formed of a ring-shaped flat surface. The second bonding surface 322 has a shape substantially similar to that of the first bonding surface 306 of the outer case 301 in the plan view, and when the inner case 320 is set on the outer case 301, the two surfaces face each other with the bonding member 310 sandwiched therebetween. The configurations of the outer case 301 and the inner case 320 are one example, and the invention is not limited to this structure.

A configuration of the substrate 315 on which an inertial sensor is mounted will be described with reference to FIG. 18. As illustrated in FIG. 18, the substrate 315 is a multilayer substrate having a plurality of through-holes formed therein, and a glass epoxy substrate is used as the substrate 315. It is not limited to a glass epoxy substrate, and any rigid substrate capable of mounting a plurality of inertial sensors, electronic components, connectors and the like may be used. For example, a composite substrate or a ceramic substrate may be used.

On a surface of the substrate 315 (surface on the side of the inner case 320), a connector 316, an angular velocity sensor 317z, the physical quantity sensor 1 as an acceleration sensor, and the like are mounted. The connector 316 is a plug type (male) connector, and is provided with two rows of connection terminals disposed at an equal pitch in the X axis direction. Preferably, connection terminals with 20 pins in total (two rows of 10 pins in one row) are used. However, the number of terminals may be appropriately changed according to design specifications.

An angular velocity sensor 317z as an inertial sensor is a gyro sensor that measures angular velocity of one axis in the Z axis direction. As a preferred example, an oscillating gyro sensor which uses crystal as an oscillator and measures angular velocity from the Coriolis force applied to an oscillating object is used. It is not limited to an oscillating gyro sensor but may be a sensor capable of measuring angular velocity. For example, a sensor using ceramics or silicon as the oscillator may be used.

On the side surface of the substrate 315 in the X axis direction, an angular velocity sensor 317x for measuring the angular velocity of one axis in the X axis direction is mounted so that the mounting surface (installation surface) is orthogonal to the X axis. Similarly, on the side surface in the Y axis direction of the substrate 315, an angular velocity sensor 317y for measuring the angular velocity of one axis in the Y axis direction is mounted so that the mounting surface (installation surface) is orthogonal to the Y axis.

The angular velocity sensor elements 300 described with reference to FIGS. 15A and 15B can be used as the angular velocity sensors 317x, 317y, and 317z. The invention is not limited to a configuration using three angular velocity sensors for each axis but may be any sensor capable of measuring the angular velocity of three axes. For example, a sensor device capable of measuring (detecting) angular velocities of three axes with one device (package) as in the physical quantity sensor 1 described later may be used.

The physical quantity sensor 1 similar to that described in the first embodiment is bonded with the package 7 (see FIG. 2A) using the resin adhesive 18 (see FIG. 2A) using an electrostatic capacitance type acceleration sensor element 20 (for example, see FIG. 5) in which, for example, a silicon substrate is processed by a MEMS technology, which can measure (detect) acceleration in three directions (three axes) of the X axis, the Y axis, and the Z axis in a single device. A physical quantity sensor to which the acceleration sensor element 202 capable of measuring acceleration in two axis directions of the X axis and the Y axis or the acceleration sensor element 201 capable of measuring acceleration in one axis direction is applied can be used if necessary.

A control IC 319 as a control unit is mounted on the rear surface (surface on the outer case 301 side) of the substrate 315. The control IC 319 is a micro controller unit (MCU) that incorporates a storage unit including a nonvolatile memory, an A/D converter, and the like, and controls each portion of the inertial measurement unit 3000. The storage unit stores a program that defines the order and contents for measuring acceleration and angular velocity, a program that digitizes measurement data and incorporates the measured data into packet data, accompanying data, and the like. A plurality of electronic components are mounted on the substrate 315.

According to such an inertial measurement unit 3000, since the physical quantity sensor 1 of the first embodiment which uses the acceleration sensor element 20 bonded with the package 7 (See FIG. 2A) via the resin adhesive 18 (See FIG. 2A) is used, the temperature hysteresis at the output of the acceleration data, which is caused by the heating processing such as mounting the inertial measurement unit 3000 can be reduced. Therefore, it is possible to provide the inertial measurement unit 3000 with enhanced reliability.

Portable Electronic Device

Next, a portable electronic device using the physical quantity sensors 1, 1A, 1B, and 1C will be described in detail based on FIGS. 19 and 20. Hereinafter, an example using the physical quantity sensor 1 will be described. Hereinafter, a wristwatch type activity meter (active tracker) will be described as an example of a portable electronic device.

Figure 19:
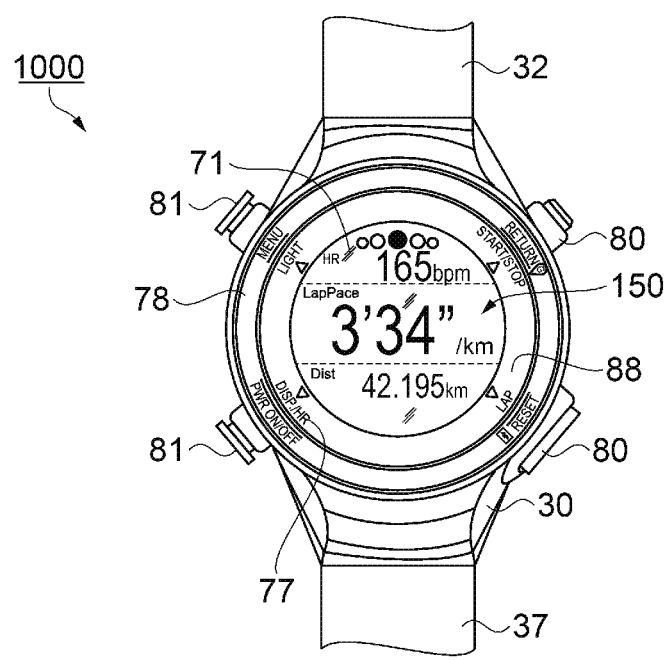
FIG. 19 is a plan view schematically illustrating a configuration of a portable electronic device.
Figure 20:
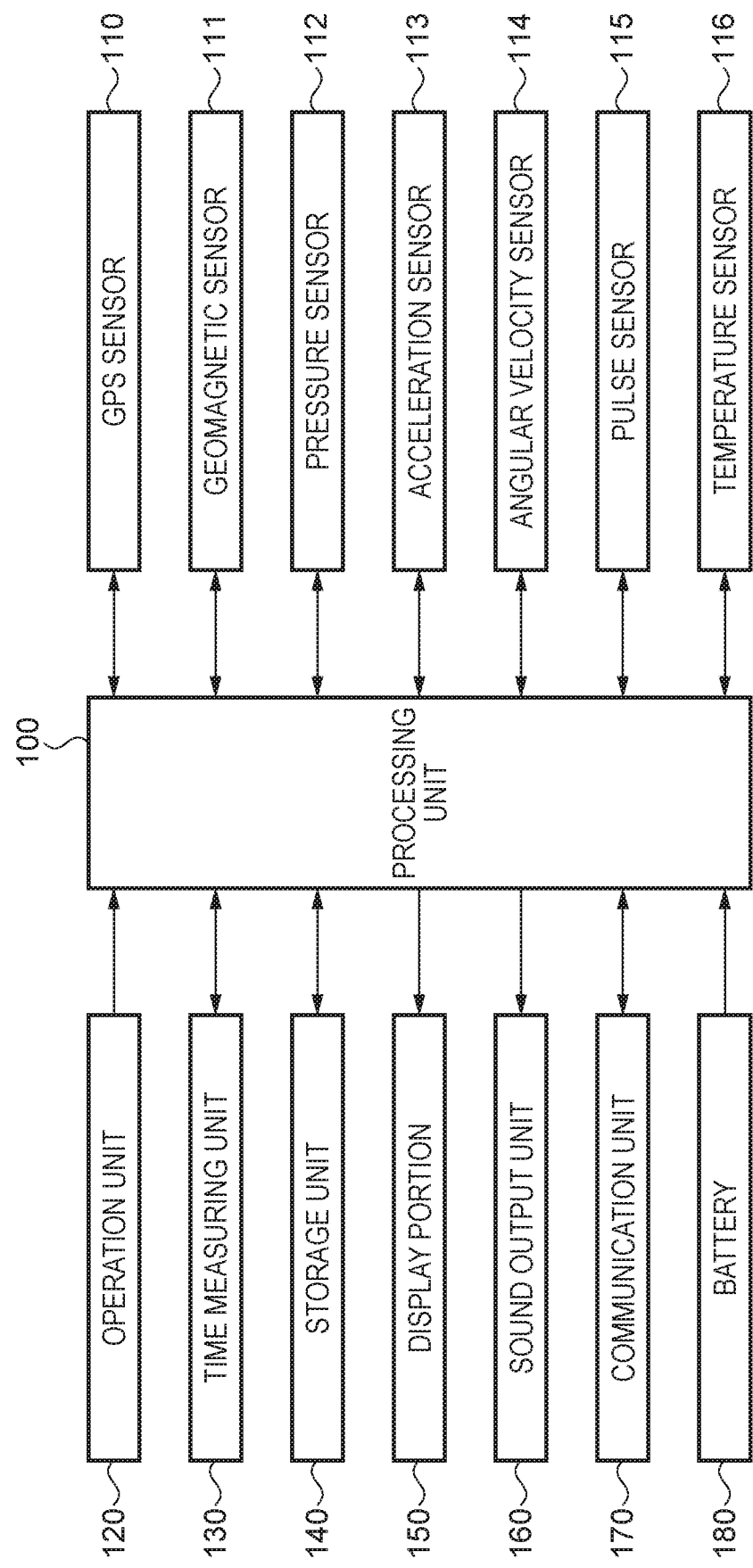
FIG. 20 is a functional block diagram illustrating a schematic configuration of the portable electronic device.

As described in FIG. 19, a wrist device 1000 that is the wristwatch type activity meter (active tracker) is attached to a site (subject) such as a wrist of a user by bands 32, 37 or the like, has a display portion 150 of digital display and can perform wireless communication. The above-described physical quantity sensor 1 according to the invention is incorporated in the wrist device 1000 as a sensor for measuring acceleration or a sensor for measuring angular velocity.

The wrist device 1000 includes at least the case 30 in which the physical quantity sensor 1 is stored, a processing unit 100 (See FIG. 20) that is stored in the case 30, and processes output data from the physical quantity sensor 1, the display portion 150 stored in the case 30, and a light-transmissive cover 71 that covers an opening portion of the case 30. On the outside of the case 30 of the light-transmissive cover 71 of the case 30, a bezel 78 is provided. On the side surface of the case 30, a plurality of operation buttons 80 and 81 are provided. Hereinafter, it will be described in more detail referring also to FIG. 20.

The acceleration sensor 113 as the physical quantity sensor 1 measures each acceleration in three axis directions intersecting (ideally, orthogonal) each other, and outputs a signal (acceleration signal) corresponding to the magnitude and direction of the measured three-axis acceleration. The angular velocity sensor 114 measures each angular velocity in three axis directions intersecting (ideally, orthogonal) each other, and outputs a signal (angular velocity signal) corresponding to the magnitude and direction of the measured three-axis angular velocity.

On a liquid crystal display (LCD) constituting the display portion 150, depending on each measurement mode, for example, position information using the GPS sensor 110 or the geomagnetic sensor 111, motion information such as movement amount, exercise amount using acceleration sensor 113 included in the physical quantity sensor 1 or angular velocity sensor 114, biometric information such as pulse rate using pulse sensor 115, time information such as current time, and the like are displayed. It is also possible to display the ambient temperature using the temperature sensor 116.

The communication unit 170 performs various controls for establishing communication between the user terminal and the information terminal (not illustrated). The communication unit 170 includes, for example, Bluetooth (registered trademark) (including BTLE: Bluetooth Low Energy), Wi-Fi (registered trademark) (Wireless Fidelity), Zigbee (registered trademark), near field communication (NFC), and ANT+ (registered trademark) as a transmitter and receiver compatible with the short distance wireless communication standard, and the communication unit 170 is configured to include a connector compatible with a communication bus standard such as a universal serial bus (USB).

The processing unit 100 (processor) is configured by, for example, a micro processing unit (MPU), a digital signal processor (DSP), and an application specific integrated circuit (ASIC). The processing unit 100 executes various processes based on the program stored in a storage unit 140 and the signal input from an operation unit 120 (for example, operation buttons 80 and 81). Processing by the processing unit 100 includes data processing for each output signal of a GPS sensor 110, a geomagnetic sensor 111, a pressure sensor 112, an acceleration sensor 113, an angular velocity sensor 114, a pulse sensor 115, a temperature sensor 116, and a time measuring unit 130, display processing for displaying an image on a display portion 150, a sound output process for outputting a sound to the sound output unit 160, communication processing for communicating with an information terminal via a communication unit 170, power control processing for supplying power from a battery 180 to each unit, and the like.

In such a wrist device 1000, at least the following functions can be provided.
 1. Distance: Measure the total distance from the start of measurement with high accuracy GPS function.
 2. Pace: Display the current travel pace from the pace distance measurement.
 3. Average speed: Calculate and display average speed from the average speed running start to the present.
 4. Height: Measure and display altitude by GPS function.
 5. Stride: Measure and display the stride even in a tunnel and the like where GPS radio waves do not reach.
 6. Pitch: Measure and display the number of steps per minute.
 7. Heart Rate: Measure and display heart rate with pulse sensor.
 8. Gradient: Measure and display the gradient of the ground in training and trail runs in the mountains.
 9. Autolap: Automatically perform lap measurement when running for a fixed distance or for a fixed time set in advance.
 10. Exercise consumption calorie: Display calorie consumption.
 11. Number of steps: Display the total number of steps from the start of the exercise.

The wrist device 1000 can be widely applied to a running watch, a runner's watch, a multi-sports compatible runner's watch such as Duathlon and triathlon, an outdoor watch, and a GPS watch in which a satellite positioning system such as GPS is installed, and the like.

A global positioning system (GPS) as a satellite positioning system is described above, and other global navigation satellite systems (GNSS) may be used. For example, any one or more satellite positioning system of European geostationary-satellite navigation overlay service (EGNOS), Quasi Zenith satellite system (QZSS), global navigation satellite system (GLONASS), GALILEO, BeiDou navigation satellite system (BeiDou) may be used. At least one of satellite-based augmentation systems (SBAS) such as a wide area augmentation system (WAAS), a European geostationary-satellite navigation overlay service (EGNOS) may be used for the satellite positioning systems.

Since such a portable electronic device is provided with the physical quantity sensor 1 and the processing unit 100, it has excellent reliability.

Electronic Device

Next, an electronic device using the physical quantity sensors 1, 1A, 1B, and 1C will be described in detail based on FIGS. 21 to 23. Hereinafter, an example using the physical quantity sensor 1 will be described.

First, a mobile type personal computer which is an example of an electronic device will be described with reference to FIG. 21. FIG. 21 is a perspective view schematically illustrating a configuration of a mobile personal computer which is an example of an electronic device.

Figure 21:
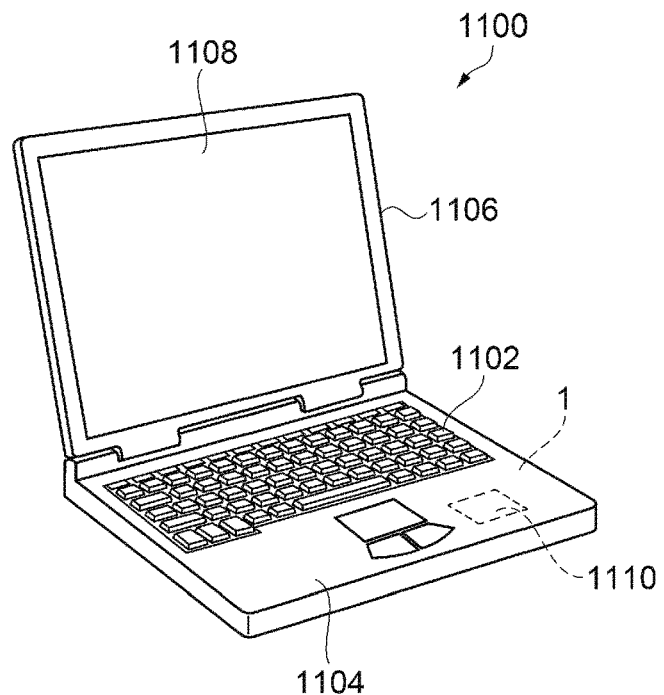
FIG. 21 is a perspective view schematically illustrating a configuration of a mobile personal computer which is an example of an electronic device.

In FIG. 21, a personal computer 1100 is configured with a main body portion 1104 having a keyboard 1102 and a display unit 1106 having a display portion 1108, and the display unit 1106 is rotatably supported relative to the main body portion 1104 via a hinge structure portion. In such a personal computer 1100, the physical quantity sensor 1 functioning as an acceleration sensor is incorporated, and a control unit 1110 can perform control such as attitude control based on the measurement data of the physical quantity sensor 1.

Figure 22:
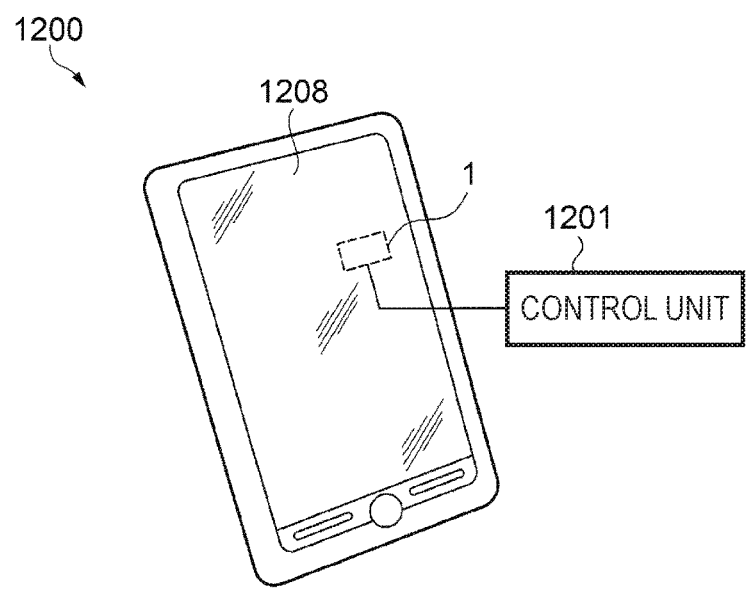
FIG. 22 is a perspective view schematically illustrating a configuration of a smart phone (portable telephone) which is an example of an electronic device.

FIG. 22 is a perspective view schematically illustrating a configuration of a smart phone (portable telephone) which is an example of an electronic device.

In FIG. 22, a smart phone 1200 has the physical quantity sensor 1 incorporated therein. The measurement data (acceleration data) measured by the physical quantity sensor 1 is transmitted to the control unit 1201 of the smart phone 1200. The control unit 1201 includes a central processing unit (CPU). The control unit 1201 can recognize the attitude and behavior of the smart phone 1200 from the received measurement data, change the display image displayed on a display portion 1208, sound an alarm sound or effect sound, or drive the oscillation motor to oscillate the main body. In other words, motion sensing of the smart phone 1200 can be performed, and display contents can be changed, sounds, oscillations, and the like can be generated from the measured attitudes and behaviors. In particular, in the case of executing an application of a game, it is possible to enjoy realistic feeling close to reality.

Figure 23:
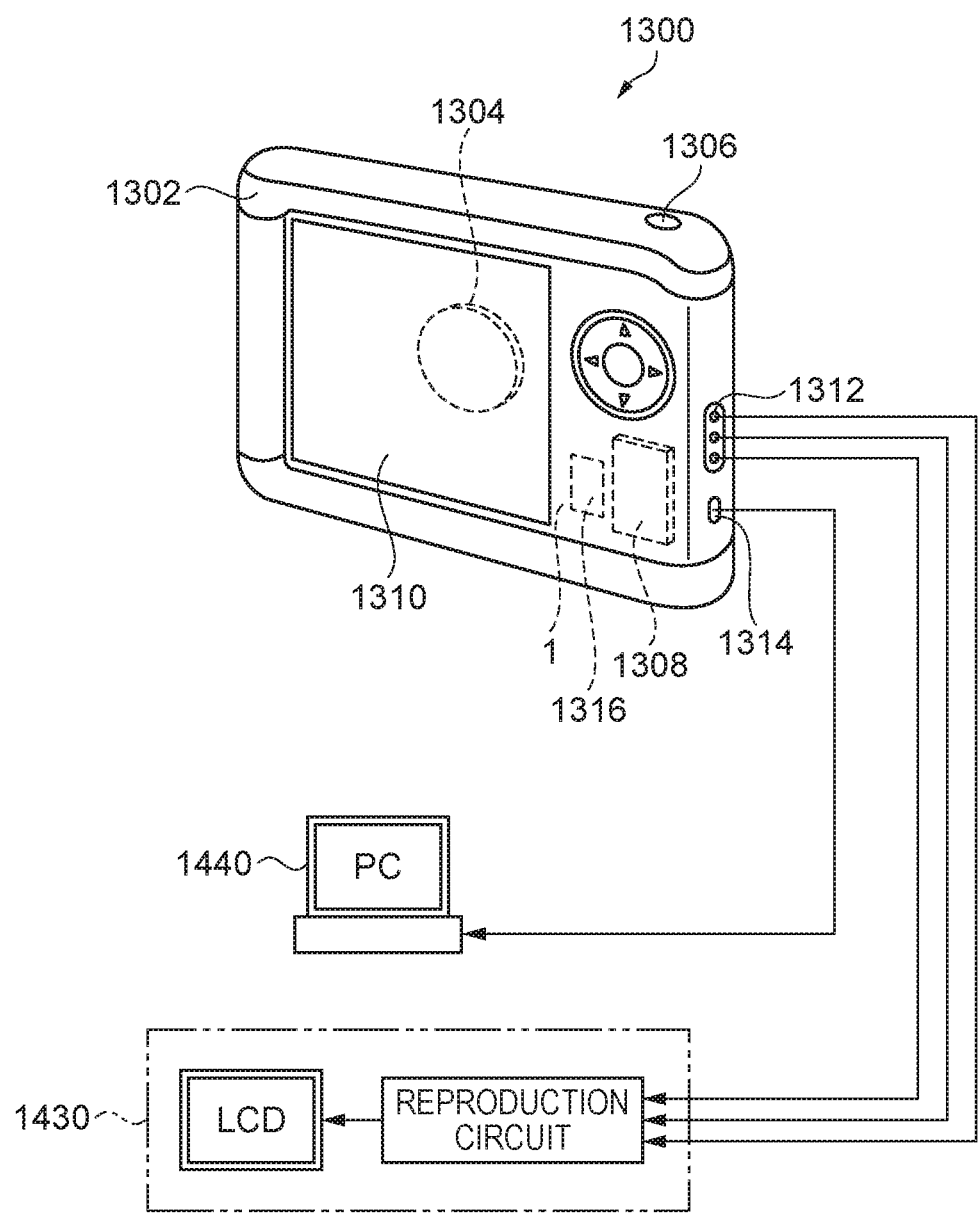
FIG. 23 is a perspective view illustrating a configuration of a digital still camera which is an example of an electronic device.

FIG. 23 is a perspective view illustrating a configuration of a digital still camera which is an example of an electronic device. In FIG. 23, connections with external devices are also illustrated briefly.

A display portion 1310 is provided on a back surface of a case (body) 1302 of a digital still camera 1300, and display is performed based on an image pickup signal by a CCD. The display portion 1310 also functions as a finder that displays the subject as an electronic image. A light receiving unit 1304 including an optical lens (image pickup optical system) and a CCD or the like is provided on the front side (rear side in the drawing) of the case 1302.

When a photographer checks the subject image displayed on the display portion 1310 and presses a shutter button 1306, the image pickup signal of the CCD at that time is transferred and stored in a memory 1308. The digital still camera 1300 is provided with a video signal output terminal 1312 and an input and output terminal for data communication 1314 on a side surface of the case 1302. As illustrated in FIG. 23, a television monitor 1430 is connected to the video signal output terminal 1312 and a personal computer 1440 is connected to the input and output terminal for data communication 1314, respectively, as required. The image pickup signal stored in the memory 1308 is output to the television monitor 1430 or the personal computer 1440 by a predetermined operation. In such a digital still camera 1300, the physical quantity sensor 1 functioning as an acceleration sensor is incorporated, and a control unit 1316 can perform control such as hand-shake correction based on the measurement data of the physical quantity sensor 1.

Since such an electronic device is provided with the physical quantity sensor 1 and the control units 1110, 1201, and 1316, it has excellent reliability.

An electronic device including the physical quantity sensor 1 can be applied to, for example, a tablet terminal, a clock, an ink jet type discharging device (for example, an ink jet printer), a laptop type personal computer, a television, a video camera, a video tape recorder, a car navigation device, a pager, an electronic notebook (including communication function), an electronic dictionary, a calculator, an electronic game machine, a word processor, a workstation, a video phone, a security monitor for television, an electronic binocular, a POS terminal, a medical device (for example, an electronic thermometer, a blood pressure monitor, a blood glucose meter, an electrocardiogram measurement device, ultrasonic diagnostic equipment, electronic endoscope), a fish finder, various measuring instruments, instruments (for example, instruments of vehicles, aircraft, ships), a flight simulator, a seismograph, a pedometer, an inclinometer, a vibrometer to measure vibration of hard disk, an attitude control device of an aircraft such as a robot and a drone, control equipment used for inertial navigation for automatic operation of automobile, and the like, in addition to the personal computer of FIG. 21, the smart phone (mobile phone) of FIG. 22, and the digital still camera of FIG. 23.

Vehicle

Figure 24:
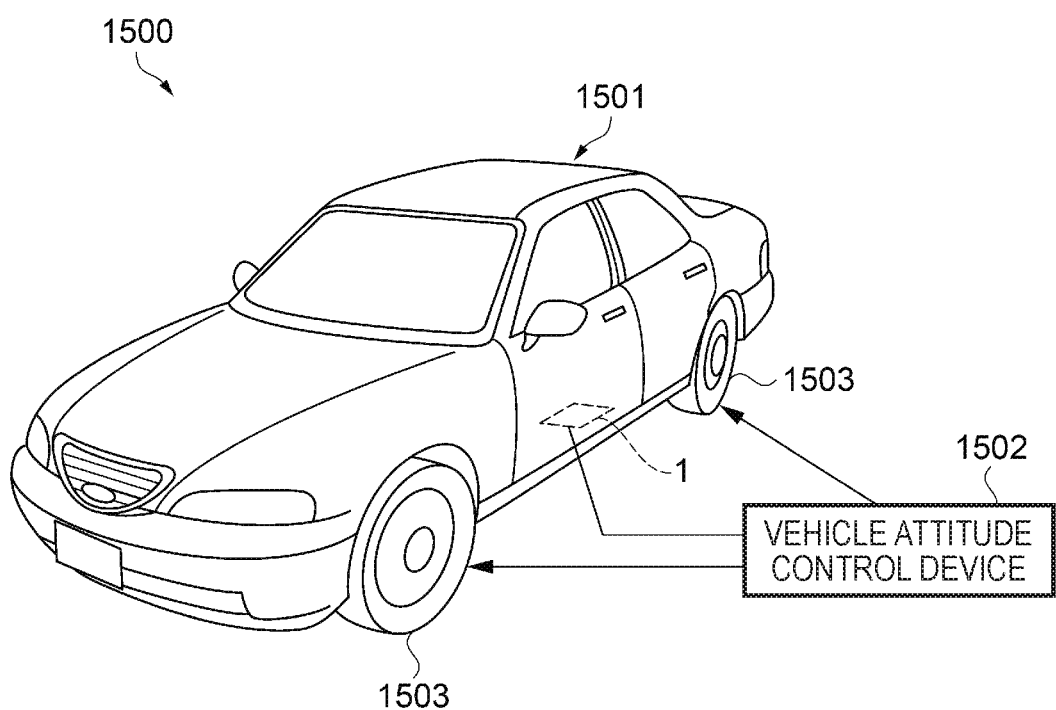
FIG. 24 is a perspective view illustrating a configuration of an automobile which is an example of a vehicle.

Next, an example in which the physical quantity sensor 1 is used as a representative example of a vehicle using the physical quantity sensors 1, 1A, 1B, and 1C is illustrated in FIG. 24 and described in detail. FIG. 24 is a perspective view illustrating a configuration of an automobile which is an example of a vehicle.

As illustrated in FIG. 24, the physical quantity sensor 1 is incorporated in an automobile 1500, and for example, an attitude of a vehicle body 1501 may be measured by the physical quantity sensor 1. A measurement signal of the physical quantity sensor 1 is supplied to a vehicle attitude control device 1502 as an attitude control unit that controls an attitude of the vehicle, and the vehicle attitude control device 1502 measures the attitude of the vehicle body 1501 based on the signal. It is possible to control the hardness of the suspension according to the measurement result and to control the brakes of individual wheels 1503. The physical quantity sensor 1 can also be widely applied to a keyless entry, an immobilizer, a car navigation system, a car air conditioner, an antilock brake system (ABS), an airbag, a tire pressure monitoring system (TPMS), engine control, a control equipment of an inertial navigation for automatic operation, and an electronic control unit (ECU) such as a battery monitor of a hybrid car or an electric car.

The physical quantity sensor 1 applied to a vehicle may be used in other application examples, for example, an attitude control of a bipedal walking robot and train, an attitude control of a remote control of a radio control airplane, a radio control helicopter or a drone or autonomous aircraft, an attitude control of an agricultural machinery (farm machine), or a construction machine (construction machine). As described above, the physical quantity sensor 1 and each control unit (not illustrated) are incorporated to realize attitude control of various vehicles.

Since such a vehicle is provided with the physical quantity sensor 1 and the control unit (not illustrated), it has excellent reliability.

The physical quantity sensor, an inertial measurement system, the electronic device, and the vehicle are described based on drawings of embodiments. However, the invention is not limited to this, and the configuration of each part can be replaced with any configuration having the same function. Further, any other constituent may be added to the invention.

In the above-described embodiments, the configuration in which the acceleration sensor element has three sensor units is described, the number of sensor portions is not limited to this, and may be one, two, or four or more. In the above-described embodiments, an acceleration sensor element is used as a sensor element of a physical quantity sensor. However, the physical quantity sensor is not limited to an acceleration sensor element, and may be, for example, a pressure sensor element or an angular velocity sensor element. For example, it may be a complex sensor capable of simultaneously measuring different physical quantities such as acceleration and angular velocity.

The entire disclosure of Japanese Patent Application No. 2017-164032, filed Aug. 29, 2017 is expressly incorporated by reference herein.

What is claimed is:

1. A physical quantity sensor comprising:
a sensor element; and
a ceramic substrate to which the sensor element is directly bonded using a bonding material,
wherein, when an elastic modulus of the bonding material is e, $4.0 \text{ GPa} \leq e \leq 6.0 \text{ GPa}$ is satisfied,
wherein, in a plan view seen from a direction along an attachment direction of the sensor element and the substrate, and
a ratio of a bonding area of the bonding material with respect to an area where the substrate and the sensor element overlap is higher than or equal to 80%.

2. The physical quantity sensor according to claim 1,
wherein a glass transition temperature of the bonding material is outside an operation temperature range of the sensor element, the operating temperature range of the sensor element being −40 degrees C. to 85 degrees C.

3. The physical quantity sensor according to claim 1,
wherein a thickness of the bonding material is less than 50 μm.

4. The physical quantity sensor according to claim 1,
wherein a circuit element that is electrically connected to the sensor element is included.

5. The physical quantity sensor according to claim 4,
wherein the circuit element is attached to a major surface of the sensor element that is located distal from the substrate.

6. The physical quantity sensor according to claim 4,
wherein a lid bonded with the substrate so as to configure a storage space with the substrate is included, and
the sensor element and the circuit element are stored in the storage space.

7. The physical quantity sensor according to claim 1, wherein the sensor element includes
a base substrate,
a cap bonded with the base substrate so as to constitute a storage space between the cap and the base substrate, and
a sensor unit that is stored in the storage space.

8. The physical quantity sensor according to claim 7, wherein the base substrate is formed of a silicon material or a glass material.

9. The physical quantity sensor according to claim 7, wherein the sensor unit is formed of a silicon material.

10. The physical quantity sensor according to claim 8, wherein the cap is formed of silicon or glass.

11. A vehicle comprising:
the physical quantity sensor according to claim 1; and
an attitude control unit that controls an attitude based on a measurement signal output from the physical quantity sensor.

* * * * *